(12) United States Patent
Fjelstad

(10) Patent No.: US 8,796,830 B1
(45) Date of Patent: Aug. 5, 2014

(54) STACKABLE LOW-PROFILE LEAD FRAME PACKAGE

(75) Inventor: Joseph C. Fjelstad, Maple Valley, WA (US)

(73) Assignee: Google Inc., Mountain View, CA (US)

( * ) Notice: Subject to any disclaimer, the term of this patent is extended or adjusted under 35 U.S.C. 154(b) by 809 days.

(21) Appl. No.: 11/515,167

(22) Filed: Sep. 1, 2006

(51) Int. Cl.
H01L 23/495 (2006.01)

(52) U.S. Cl.
USPC ..... 257/676; 257/774; 257/686; 257/E23.001

(58) Field of Classification Search
USPC .......... 257/676, 774, 686, 741, 746; 438/559, 438/462, 667, 469
See application file for complete search history.

(56) References Cited

U.S. PATENT DOCUMENTS

| 3,800,292 | A | 3/1974 | Curley et al. | |
| 4,069,452 | A | 1/1978 | Conway et al. | |
| 4,323,965 | A | 4/1982 | Johnson et al. | |
| 4,334,307 | A | 6/1982 | Bourgeois et al. | |
| 4,345,319 | A | 8/1982 | Bernardini et al. | |
| 4,392,212 | A | 7/1983 | Miyasaka et al. | 365/230 |
| 4,500,958 | A | 2/1985 | Manton et al. | |
| 4,525,921 | A | 7/1985 | Carson et al. | 29/577 |
| 4,566,082 | A | 1/1986 | Anderson | |
| 4,592,019 | A | 5/1986 | Huang et al. | 365/78 |
| 4,628,407 | A | 12/1986 | August et al. | |
| 4,646,128 | A | 2/1987 | Carson et al. | 357/74 |
| 4,698,748 | A | 10/1987 | Juzswik et al. | 364/200 |
| 4,706,166 | A | 11/1987 | Go | 361/403 |
| 4,710,903 | A | 12/1987 | Hereth et al. | 365/194 |
| 4,764,846 | A | 8/1988 | Go | 361/388 |
| 4,780,843 | A | 10/1988 | Tietjen | 364/900 |
| 4,794,597 | A | 12/1988 | Ooba et al. | |
| 4,796,232 | A | 1/1989 | House | 365/189 |
| 4,807,191 | A | 2/1989 | Flannagan | |
| 4,841,440 | A | 6/1989 | Yonezu et al. | 364/200 |
| 4,862,347 | A | 8/1989 | Rudy | |

(Continued)

FOREIGN PATENT DOCUMENTS

| DE | 102004051345 | 5/2006 | ............. G11C 29/12 |
| DE | 102004053316 | 5/2006 | |

(Continued)

OTHER PUBLICATIONS

Non-final Office Action from U.S. Appl. No. 11/461,430 mailed on Feb. 19, 2009.

(Continued)

Primary Examiner — Mark A Laurenzi
(74) Attorney, Agent, or Firm — Fish & Richardson P.C.

(57) ABSTRACT

In an embodiment, an IC assembly comprises an IC having a top surface comprising a plurality of input/output terminations, a plurality of leads arranged around the IC, a plurality of bond wires, and an encapsulant. Each lead has a first surface and a second surface opposite the first surface, and has a feature protruding from the first surface proximate an inward end of the lead nearest the IC. The feature extends from the first surface to approximately a plane that includes a bottom surface of the IC. Each bond wire connects a respective lead to a respective I/O terminal on the IC. The encapsulant seals the bond wires, the IC, and a first portion of the leads that includes the feature. The feature creates on offset from the bottom of the IC to permit the encapsulant to surround the first portion.

9 Claims, 15 Drawing Sheets

(56) References Cited

U.S. PATENT DOCUMENTS

| | | | |
|---|---|---|---|
| 4,884,237 A | 11/1989 | Mueller et al. ............... 365/63 |
| 4,887,240 A | 12/1989 | Garverick et al. ............ 361/222 |
| 4,888,687 A | 12/1989 | Allison et al. |
| 4,899,107 A | 2/1990 | Corbett et al. ............... 324/158 |
| 4,912,678 A | 3/1990 | Mashiko |
| 4,916,575 A | 4/1990 | Van Asten |
| 4,922,451 A | 5/1990 | Lo et al. |
| 4,935,734 A | 6/1990 | Austin ................... 340/825.83 |
| 4,937,791 A | 6/1990 | Steele et al. |
| 4,956,694 A | 9/1990 | Eide |
| 4,982,265 A | 1/1991 | Watanabe et al. ............ 357/75 |
| 4,983,533 A | 1/1991 | Go ................................ 437/7 |
| 5,025,364 A | 6/1991 | Zellmer |
| 5,072,424 A | 12/1991 | Brent et al. .................. 365/189 |
| 5,083,266 A | 1/1992 | Watanabe .................... 395/275 |
| 5,104,820 A | 4/1992 | Go et al. ....................... 437/51 |
| 5,193,072 A | 3/1993 | Frenkil et al. |
| 5,212,666 A | 5/1993 | Takeda |
| 5,220,672 A | 6/1993 | Nakao et al. .................. 395/750 |
| 5,222,014 A | 6/1993 | Lin |
| 5,241,266 A | 8/1993 | Ahmad et al. ................ 324/158 |
| 5,252,807 A | 10/1993 | Chizinsky .................... 219/390 |
| 5,257,233 A | 10/1993 | Schaefer ...................... 365/227 |
| 5,278,796 A | 1/1994 | Tillinghast et al. ........... 365/211 |
| 5,282,177 A | 1/1994 | McLaury ..................... 365/230 |
| 5,332,922 A | 7/1994 | Oguchi et al. ................ 257/723 |
| 5,347,428 A | 9/1994 | Carson et al. ................ 361/760 |
| 5,369,749 A | 11/1994 | Baker et al. |
| 5,384,745 A | 1/1995 | Konishi et al. ........... 365/230.03 |
| 5,388,265 A | 2/1995 | Volk ............................ 395/750 |
| 5,390,078 A | 2/1995 | Taylor |
| 5,390,334 A | 2/1995 | Harrison |
| 5,392,251 A | 2/1995 | Manning |
| 5,408,190 A | 4/1995 | Wood et al. .................. 324/765 |
| 5,432,729 A | 7/1995 | Carson et al. ................ 365/63 |
| 5,448,511 A | 9/1995 | Paurus et al. ................ 365/52 |
| 5,453,434 A | 9/1995 | Albaugh et al. .............. 514/397 |
| 5,467,455 A | 11/1995 | Gay et al. .................... 395/281 |
| 5,483,497 A | 1/1996 | Mochizuki et al. |
| 5,498,886 A | 3/1996 | Hsu et al. .................... 257/213 |
| 5,502,333 A | 3/1996 | Bertin et al. |
| 5,502,667 A | 3/1996 | Bertin et al. ................. 365/51 |
| 5,513,135 A | 4/1996 | Dell et al. |
| 5,513,339 A | 4/1996 | Agrawal et al. |
| 5,519,832 A | 5/1996 | Warchol |
| 5,526,320 A | 6/1996 | Zagar et al. .................. 365/233 |
| 5,530,836 A | 6/1996 | Busch et al. ................. 395/477 |
| 5,550,781 A | 8/1996 | Sugawara et al. |
| 5,559,990 A | 9/1996 | Cheng et al. ................. 395/484 |
| 5,561,622 A | 10/1996 | Bertin et al. .................. 365/51 |
| 5,563,086 A | 10/1996 | Bertin et al. .................. 437/52 |
| 5,566,344 A | 10/1996 | Hall et al. ..................... 395/800 |
| 5,581,498 A | 12/1996 | Ludwig et al. ................ 365/63 |
| 5,581,779 A | 12/1996 | Hall et al. ..................... 395/800 |
| 5,590,071 A | 12/1996 | Kolor et al. ................... 365/149 |
| 5,598,376 A | 1/1997 | Merritt et al. ................. 365/230 |
| 5,604,714 A | 2/1997 | Manning et al. .............. 365/230 |
| 5,606,710 A | 2/1997 | Hall et al. ..................... 395/800 |
| 5,608,262 A | 3/1997 | Degani et al. ................ 257/723 |
| 5,610,864 A | 3/1997 | Manning ..................... 365/193 |
| 5,623,686 A | 4/1997 | Hall et al. ..................... 395/800 |
| 5,627,791 A | 5/1997 | Wright et al. ................. 365/222 |
| 5,640,337 A | 6/1997 | Huang et al. ................. 364/578 |
| 5,640,364 A | 6/1997 | Merritt et al. ................. 365/233 |
| 5,652,724 A | 7/1997 | Manning ..................... 365/189 |
| 5,654,204 A | 8/1997 | Anderson .................... 438/15 |
| 5,661,677 A | 8/1997 | Rondeau et al. ............. 365/63 |
| 5,661,695 A | 8/1997 | Zagar et al. .................. 365/233 |
| 5,668,773 A | 9/1997 | Zagar et al. .................. 365/233 |
| 5,675,549 A | 10/1997 | Ong et al. .................... 365/233 |
| 5,680,342 A | 10/1997 | Frankeny .................... 365/52 |
| 5,682,354 A | 10/1997 | Manning ..................... 365/233 |
| 5,692,121 A | 11/1997 | Bozso et al. |
| 5,692,202 A | 11/1997 | Kardach et al. .............. 395/750 |
| 5,696,732 A | 12/1997 | Zagar et al. .................. 365/233 |
| 5,696,929 A | 12/1997 | Hasbun et al. |
| 5,702,984 A | 12/1997 | Bertin et al. .................. 437/208 |
| 5,703,813 A | 12/1997 | Manning et al. .............. 365/189 |
| 5,706,247 A | 1/1998 | Merritt et al. ................. 365/233 |
| RE35,733 E | 2/1998 | Hernandez et al. |
| 5,717,654 A | 2/1998 | Manning ..................... 365/233 |
| 5,721,859 A | 2/1998 | Manning ..................... 397/421 |
| 5,724,288 A | 3/1998 | Cloud et al. .................. 365/193 |
| 5,729,503 A | 3/1998 | Manning ..................... 365/233 |
| 5,729,504 A | 3/1998 | Cowles ........................ 365/236 |
| 5,742,792 A | 4/1998 | Yanai et al. |
| 5,748,914 A | 5/1998 | Barth et al. ................... 395/285 |
| 5,752,045 A | 5/1998 | Chen ........................... 395/750 |
| 5,757,703 A | 5/1998 | Merritt et al. ................. 365/189 |
| 5,760,478 A | 6/1998 | Bozso et al. |
| 5,761,703 A | 6/1998 | Bolyn ........................... 711/106 |
| 5,781,766 A | 7/1998 | Davis ........................... 395/552 |
| 5,787,457 A | 7/1998 | Miller et al. |
| 5,798,961 A | 8/1998 | Heyden et al. ................ 365/52 |
| 5,802,010 A | 9/1998 | Zagar et al. .................. 365/233 |
| 5,802,395 A | 9/1998 | Connolly et al. |
| 5,802,555 A | 9/1998 | Shigeeda ..................... 711/106 |
| 5,812,488 A | 9/1998 | Zagar et al. .................. 365/233 |
| 5,818,788 A | 10/1998 | Kimura et al. |
| 5,819,065 A | 10/1998 | Chilton et al. |
| 5,831,833 A | 11/1998 | Shirakawa et al. |
| 5,831,931 A | 11/1998 | Manning ..................... 365/233 |
| 5,831,932 A | 11/1998 | Merritt et al. ................. 365/233 |
| 5,834,838 A | 11/1998 | Anderson ..................... 257/697 |
| 5,835,435 A | 11/1998 | Bogin et al. .................. 365/22 |
| 5,838,165 A | 11/1998 | Chatter |
| 5,838,177 A | 11/1998 | Keeth ........................... 327/108 |
| 5,841,580 A | 11/1998 | Farmwald et al. ............ 365/194 |
| 5,843,799 A | 12/1998 | Hsu et al. ..................... 438/6 |
| 5,843,807 A | 12/1998 | Burns ........................... 438/109 |
| 5,845,108 A | 12/1998 | Yoo et al. ..................... 395/551 |
| 5,850,368 A | 12/1998 | Ong et al. ..................... 365/238 |
| 5,859,792 A | 1/1999 | Rondeau et al. .............. 365/52 |
| 5,860,106 A | 1/1999 | Domen et al. ................ 711/137 |
| 5,870,347 A | 2/1999 | Keeth et al. ................... 365/230 |
| 5,870,350 A | 2/1999 | Bertin |
| 5,872,907 A | 2/1999 | Griess et al. |
| 5,875,142 A | 2/1999 | Chevallier .................... 365/212 |
| 5,878,279 A | 3/1999 | Athenes |
| 5,884,088 A | 3/1999 | Kardach et al. ............ 395/750.06 |
| 5,901,105 A | 5/1999 | Ong et al. ................ 365/230.06 |
| 5,903,500 A | 5/1999 | Tsang et al. ............. 365/189.05 |
| 5,905,688 A | 5/1999 | Park ............................ 365/227 |
| 5,907,512 A | 5/1999 | Parkinson et al. ............ 365/195 |
| 5,910,010 A | 6/1999 | Nishizawa et al. |
| 5,913,072 A | 6/1999 | Wieringa |
| 5,915,105 A | 6/1999 | Farmwald et al. ............ 395/309 |
| 5,915,167 A | 6/1999 | Leedy |
| 5,917,758 A | 6/1999 | Keeth ...................... 365/189.05 |
| 5,923,611 A | 7/1999 | Ryan ............................ 365/233 |
| 5,924,111 A | 7/1999 | Huang et al. |
| 5,926,435 A | 7/1999 | Park et al. |
| 5,929,650 A | 7/1999 | Pappert et al. ................ 324/763 |
| 5,943,254 A | 8/1999 | Bakeman, Jr. et al. ......... 365/72 |
| 5,946,265 A | 8/1999 | Cowles ........................ 365/233 |
| 5,949,254 A | 9/1999 | Keeth ........................... 326/87 |
| 5,953,215 A | 9/1999 | Karabatsos ................... 361/774 |
| 5,953,263 A | 9/1999 | Farmwald et al. ............ 365/194 |
| 5,954,804 A | 9/1999 | Farmwald et al. ............ 710/36 |
| 5,956,233 A | 9/1999 | Yew et al. ..................... 361/760 |
| 5,962,435 A | 10/1999 | Mao et al. ..................... 514/63 |
| 5,963,429 A | 10/1999 | Chen |
| 5,963,463 A | 10/1999 | Rondea et al. ................ 365/52 |
| 5,963,464 A | 10/1999 | Dell et al. ..................... 365/52 |
| 5,963,504 A | 10/1999 | Manning ..................... 365/233 |
| 5,966,724 A | 10/1999 | Ryan ............................ 711/105 |
| 5,966,727 A | 10/1999 | Nishino ........................ 711/127 |
| 5,969,996 A | 10/1999 | Muranaka et al. ........ 365/189.01 |
| 5,973,392 A | 10/1999 | Senba et al. .................. 257/686 |
| 5,978,304 A | 11/1999 | Crafts |
| 5,995,424 A | 11/1999 | Lawrence et al. |
| 5,995,443 A | 11/1999 | Farmwald et al. ............ 365/233 |
| 6,001,671 A | 12/1999 | Fjelstad |
| 6,002,613 A | 12/1999 | Cloud et al. .................. 365/189 |

(56) References Cited

U.S. PATENT DOCUMENTS

| | | | |
|---|---|---|---|
| 6,002,627 A | 12/1999 | Chevallier | 365/212 |
| 6,014,339 A | 1/2000 | Kobayashi et al. | 365/233 |
| 6,016,282 A | 1/2000 | Keeth | 365/233 |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | 710/129 |
| 6,032,215 A | 2/2000 | Farmwald et al. | 710/129 |
| 6,034,916 A | 3/2000 | Lee | 365/233 |
| 6,034,918 A | 3/2000 | Farmwald et al. | 365/233 |
| 6,035,365 A | 3/2000 | Farmwald et al. | 710/129 |
| 6,038,195 A | 3/2000 | Farmwald et al. | 365/233 |
| 6,038,673 A | 3/2000 | Benn et al. | 713/323 |
| 6,044,032 A | 3/2000 | Li | 365/230 |
| 6,047,073 A | 4/2000 | Norris et al. | |
| 6,047,344 A | 4/2000 | Kawasumi et al. | 710/107 |
| 6,047,361 A | 4/2000 | Ingenio et al. | |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | 327/108 |
| 6,070,217 A | 5/2000 | Connolly et al. | 710/131 |
| 6,073,223 A | 6/2000 | McAllister et al. | 711/167 |
| 6,075,730 A | 6/2000 | Barth et al. | 365/191 |
| 6,075,744 A | 6/2000 | Tsern et al. | 365/230 |
| 6,078,546 A | 6/2000 | Lee | 365/233 |
| 6,079,025 A | 6/2000 | Fung | 713/323 |
| 6,084,434 A | 7/2000 | Keeth | 326/87 |
| 6,088,290 A | 7/2000 | Ohtake et al. | 365/233 |
| 6,091,251 A | 7/2000 | Wood et al. | 324/755 |
| RE36,839 E | 8/2000 | Simmons et al. | 326/93 |
| 6,101,152 A | 8/2000 | Farmwald et al. | 365/233 |
| 6,101,564 A | 8/2000 | Athenes et al. | |
| 6,101,612 A | 8/2000 | Jeddeloh | 713/401 |
| 6,108,795 A | 8/2000 | Jeddeloh | 713/401 |
| 6,111,812 A | 8/2000 | Gans et al. | 365/233 |
| 6,125,072 A | 9/2000 | Wu | |
| 6,134,638 A | 10/2000 | Olarig et al. | 711/167 |
| 6,154,370 A | 11/2000 | Degani et al. | 361/761 |
| 6,166,991 A | 12/2000 | Phelan | 365/233 |
| 6,181,640 B1 | 1/2001 | Kang | |
| 6,182,184 B1 | 1/2001 | Farmwald et al. | 710/129 |
| 6,199,151 B1 | 3/2001 | Williams et al. | |
| 6,208,168 B1 | 3/2001 | Rhee | 326/83 |
| 6,216,246 B1 | 4/2001 | Shau | 714/763 |
| 6,222,739 B1 | 4/2001 | Bhakta et al. | 361/790 |
| 6,226,709 B1 | 5/2001 | Goodwin et al. | |
| 6,226,730 B1 | 5/2001 | Murdoch et al. | |
| 6,233,192 B1 | 5/2001 | Tanaka | 365/222 |
| 6,233,650 B1 | 5/2001 | Johnson et al. | |
| 6,240,048 B1 | 5/2001 | Matsubara | 365/233 |
| 6,243,282 B1 | 6/2001 | Rondeau et al. | 365/52 |
| 6,252,807 B1 | 6/2001 | Suzuki et al. | 365/193 |
| 6,253,278 B1 | 6/2001 | Ryan | |
| 6,260,097 B1 | 7/2001 | Farmwald et al. | 710/129 |
| 6,260,154 B1 | 7/2001 | Jeddeloh | 713/401 |
| 6,262,938 B1 | 7/2001 | Lee et al. | 365/233 |
| 6,266,285 B1 | 7/2001 | Farmwald et al. | 365/194 |
| 6,266,292 B1 | 7/2001 | Tsern et al. | 365/230 |
| 6,274,395 B1 | 8/2001 | Weber | 438/14 |
| 6,279,069 B1 | 8/2001 | Robinson et al. | 711/103 |
| 6,295,572 B1 | 9/2001 | Wu | 710/131 |
| 6,297,966 B1 | 10/2001 | Lee et al. | |
| 6,298,426 B1 | 10/2001 | Ajanovic | 711/172 |
| 6,304,511 B1 | 10/2001 | Gans et al. | 365/233 |
| 6,307,769 B1 | 10/2001 | Nuxoll et al. | 365/63 |
| 6,314,051 B1 | 11/2001 | Farmwald et al. | 365/233 |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | 365/233 |
| 6,326,810 B1 | 12/2001 | Keeth | 326/83 |
| 6,327,664 B1 | 12/2001 | Dell et al. | 713/323 |
| 6,330,683 B1 | 12/2001 | Jeddeloh | 713/401 |
| 6,336,174 B1 | 1/2002 | Li et al. | |
| 6,338,108 B1 | 1/2002 | Motomura | 710/110 |
| 6,338,113 B1 | 1/2002 | Kubo et al. | 711/105 |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | 365/195 |
| 6,356,105 B1 | 3/2002 | Volk | 326/30 |
| 6,356,500 B1 | 3/2002 | Cloud et al. | 365/226 |
| 6,362,656 B2 | 3/2002 | Rhee | 326/87 |
| 6,363,031 B2 | 3/2002 | Phelan | 365/233 |
| 6,378,020 B2 | 4/2002 | Farmwald et al. | 710/129 |
| 6,381,188 B1 | 4/2002 | Choi et al. | 365/222 |
| 6,381,668 B1 | 4/2002 | Lunteren | 711/5 |
| 6,389,514 B1 | 5/2002 | Rokicki | |
| 6,392,304 B1 | 5/2002 | Butler | 257/777 |
| 6,414,868 B1 | 7/2002 | Wong et al. | 365/51 |
| 6,418,034 B1 | 7/2002 | Weber et al. | 361/790 |
| 6,421,754 B1 | 7/2002 | Kau et al. | |
| 6,424,532 B2 | 7/2002 | Kawamura | |
| 6,426,916 B2 | 7/2002 | Farmwald et al. | 365/233 |
| 6,429,029 B1 | 8/2002 | Eldridge et al. | 438/14 |
| 6,430,103 B2 | 8/2002 | Nakayama et al. | 365/230.03 |
| 6,434,660 B1 | 8/2002 | Lambert et al. | |
| 6,437,600 B1 | 8/2002 | Keeth | 326/86 |
| 6,438,057 B1 | 8/2002 | Ruckerbauer | |
| 6,442,698 B2 | 8/2002 | Nizar | 713/320 |
| 6,445,591 B1 | 9/2002 | Kwong | |
| 6,452,826 B1 | 9/2002 | Kim et al. | 365/51 |
| 6,452,863 B2 | 9/2002 | Farmwald et al. | 365/233 |
| 6,453,400 B1 | 9/2002 | Maesako et al. | 711/167 |
| 6,453,402 B1 | 9/2002 | Jeddeloh | 711/167 |
| 6,453,434 B2 | 9/2002 | Delp et al. | |
| 6,455,348 B1 * | 9/2002 | Yamaguchi | 438/106 |
| 6,457,095 B1 | 9/2002 | Volk | 711/105 |
| 6,459,651 B1 | 10/2002 | Lee et al. | 365/233 |
| 6,473,831 B1 | 10/2002 | Schade | 711/115 |
| 6,476,476 B1 | 11/2002 | Glenn | |
| 6,480,929 B1 | 11/2002 | Gauthier et al. | 711/105 |
| 6,487,102 B1 | 11/2002 | Halbert et al. | 365/51 |
| 6,489,669 B2 | 12/2002 | Shimada et al. | 257/686 |
| 6,490,161 B1 | 12/2002 | Johnson | |
| 6,492,726 B1 | 12/2002 | Quek et al. | |
| 6,493,789 B2 | 12/2002 | Ware et al. | 711/105 |
| 6,496,440 B2 | 12/2002 | Manning | 365/230.03 |
| 6,496,897 B2 | 12/2002 | Ware et al. | 711/105 |
| 6,498,766 B2 | 12/2002 | Lee et al. | 365/233 |
| 6,510,097 B2 | 1/2003 | Fukuyama | 365/230.03 |
| 6,510,503 B2 | 1/2003 | Gillingham et al. | 711/167 |
| 6,512,392 B2 | 1/2003 | Fleury et al. | 324/765 |
| 6,521,984 B2 | 2/2003 | Matsuura | 257/768 |
| 6,526,471 B1 | 2/2003 | Shimomura et al. | 711/5 |
| 6,526,473 B1 | 2/2003 | Kim | |
| 6,526,484 B1 | 2/2003 | Stacovsky et al. | 711/158 |
| 6,545,895 B1 | 4/2003 | Li et al. | 365/52 |
| 6,546,446 B2 | 4/2003 | Farmwald et al. | 710/305 |
| 6,553,450 B1 | 4/2003 | Dodd et al. | 711/105 |
| 6,560,158 B2 | 5/2003 | Choi et al. | 365/226 |
| 6,563,337 B2 | 5/2003 | Dour | 326/30 |
| 6,563,759 B2 | 5/2003 | Yahata et al. | 365/233 |
| 6,564,281 B2 | 5/2003 | Farmwald et al. | 710/305 |
| 6,564,285 B1 | 5/2003 | Mills et al. | 711/103 |
| 6,574,150 B2 | 6/2003 | Suyama et al. | 365/189.05 |
| 6,584,037 B2 | 6/2003 | Farmwald et al. | 365/233 |
| 6,587,912 B2 | 7/2003 | Leddige et al. | 711/5 |
| 6,590,822 B2 | 7/2003 | Hwang et al. | 365/222 |
| 6,594,770 B1 | 7/2003 | Sato et al. | 713/320 |
| 6,597,616 B2 | 7/2003 | Tsern et al. | 365/222 |
| 6,597,617 B2 | 7/2003 | Ooishi et al. | 365/222 |
| 6,614,700 B2 | 9/2003 | Dietrich et al. | 365/194 |
| 6,618,267 B1 | 9/2003 | Dalal et al. | |
| 6,618,791 B1 | 9/2003 | Dodd et al. | 711/105 |
| 6,621,760 B1 | 9/2003 | Ahmad et al. | 365/233 |
| 6,628,538 B2 | 9/2003 | Funaba et al. | |
| 6,630,729 B2 | 10/2003 | Huang | |
| 6,631,086 B1 | 10/2003 | Bill et al. | 365/185.09 |
| 6,639,820 B1 | 10/2003 | Khandekar et al. | 365/63 |
| 6,646,939 B2 | 11/2003 | Kwak | 365/219 |
| 6,650,588 B2 | 11/2003 | Yamagata | 365/222 |
| 6,650,594 B1 | 11/2003 | Lee et al. | 365/233 |
| 6,657,634 B1 | 12/2003 | Sinclair et al. | 345/534 |

(56) References Cited

U.S. PATENT DOCUMENTS

| | | | |
|---|---|---|---|
| 6,657,918 B2 | 12/2003 | Foss et al. | 365/233 |
| 6,657,919 B2 | 12/2003 | Foss et al. | 365/233 |
| 6,658,016 B1 | 12/2003 | Dai et al. | |
| 6,658,530 B1 | 12/2003 | Robertson et al. | 711/115 |
| 6,659,512 B1 | 12/2003 | Harper et al. | |
| 6,664,625 B2 | 12/2003 | Hiruma | |
| 6,665,224 B1 | 12/2003 | Lehmann et al. | 365/222 |
| 6,665,227 B2 | 12/2003 | Fetzer | 365/229 |
| 6,668,242 B1 | 12/2003 | Reynov et al. | |
| 6,674,154 B2 * | 1/2004 | Minamio et al. | 257/666 |
| 6,683,372 B1 | 1/2004 | Wong et al. | 257/686 |
| 6,684,292 B2 | 1/2004 | Piccirillo et al. | |
| 6,690,191 B2 | 2/2004 | Wu et al. | |
| 6,697,295 B2 | 2/2004 | Farmwald et al. | 365/233 |
| 6,701,446 B2 | 3/2004 | Tsern et al. | 713/501 |
| 6,705,877 B1 | 3/2004 | Li et al. | 439/74 |
| 6,708,144 B1 | 3/2004 | Merryman et al. | 703/14 |
| 6,710,430 B2 * | 3/2004 | Minamio et al. | 257/666 |
| 6,711,043 B2 | 3/2004 | Friedman et al. | |
| 6,713,856 B2 | 3/2004 | Tsai et al. | |
| 6,714,433 B2 | 3/2004 | Doblar et al. | |
| 6,714,891 B2 | 3/2004 | Dendinger | 702/132 |
| 6,724,684 B2 | 4/2004 | Kim | 365/233 |
| 6,730,540 B2 | 5/2004 | Siniaguine | |
| 6,731,009 B1 | 5/2004 | Jones et al. | |
| 6,731,527 B2 | 5/2004 | Brown | 365/63 |
| 6,742,098 B1 | 5/2004 | Halbert et al. | |
| 6,744,687 B2 | 6/2004 | Koo et al. | 365/226 |
| 6,747,887 B2 | 6/2004 | Halbert et al. | |
| 6,751,113 B2 | 6/2004 | Bhakta et al. | 365/63 |
| 6,751,696 B2 | 6/2004 | Farmwald et al. | 710/305 |
| 6,754,129 B2 | 6/2004 | Khateri et al. | 365/226 |
| 6,754,132 B2 | 6/2004 | Kyung | 365/233 |
| 6,757,751 B1 | 6/2004 | Gene | 710/36 |
| 6,762,948 B2 | 7/2004 | Kyun et al. | 365/51 |
| 6,765,812 B2 | 7/2004 | Anderson | 365/51 |
| 6,766,469 B2 | 7/2004 | Larson et al. | |
| 6,771,526 B2 | 8/2004 | LaBerge | 365/63 |
| 6,772,359 B2 | 8/2004 | Kwak et al. | 713/500 |
| 6,779,097 B2 | 8/2004 | Gillingham et al. | 711/167 |
| 6,785,767 B2 | 8/2004 | Coulson | 711/112 |
| 6,791,877 B2 | 9/2004 | Miura et al. | 365/185 |
| 6,795,899 B2 | 9/2004 | Dodd et al. | 711/137 |
| 6,799,241 B2 | 9/2004 | Kahn et al. | 711/105 |
| 6,801,989 B2 | 10/2004 | Johnson et al. | 711/167 |
| 6,807,598 B2 | 10/2004 | Farmwald et al. | 710/305 |
| 6,807,650 B2 | 10/2004 | Lamb et al. | |
| 6,807,655 B1 | 10/2004 | Rehani et al. | 716/4 |
| 6,810,475 B1 | 10/2004 | Tardieux | |
| 6,816,991 B2 | 11/2004 | Sanghani | 714/733 |
| 6,819,602 B2 | 11/2004 | Seo et al. | 365/193 |
| 6,819,617 B2 | 11/2004 | Hwang et al. | 365/222 |
| 6,820,163 B1 | 11/2004 | McCall et al. | 710/310 |
| 6,820,169 B2 | 11/2004 | Wilcox et al. | 711/105 |
| 6,826,104 B2 | 11/2004 | Kawaguchi et al. | 365/222 |
| 6,839,290 B2 | 1/2005 | Ahmad et al. | 365/193 |
| 6,844,754 B2 | 1/2005 | Yamagata | |
| 6,845,027 B2 | 1/2005 | Mayer et al. | |
| 6,845,055 B1 | 1/2005 | Koga et al. | 365/229 |
| 6,847,582 B2 | 1/2005 | Pan | 365/233 |
| 6,850,449 B2 | 2/2005 | Takahashi | 365/222 |
| 6,854,043 B2 | 2/2005 | Hargis et al. | |
| 6,862,202 B2 | 3/2005 | Schaefer | 365/52 |
| 6,862,249 B2 | 3/2005 | Kyung | 365/233 |
| 6,862,653 B1 | 3/2005 | Dodd et al. | 711/105 |
| 6,873,534 B2 | 3/2005 | Bhakta et al. | 365/63 |
| 6,878,570 B2 | 4/2005 | Lyu et al. | |
| 6,894,933 B2 | 5/2005 | Kuzmenka et al. | 365/189.05 |
| 6,898,683 B2 | 5/2005 | Nakamura | 711/167 |
| 6,908,314 B2 | 6/2005 | Brown | 439/68 |
| 6,912,778 B2 | 7/2005 | Ahn et al. | 29/852 |
| 6,914,786 B1 | 7/2005 | Paulsen et al. | |
| 6,917,219 B2 | 7/2005 | New | 326/41 |
| 6,922,371 B2 | 7/2005 | Takahashi et al. | 365/227 |
| 6,930,900 B2 | 8/2005 | Bhakta et al. | 365/51 |
| 6,930,903 B2 | 8/2005 | Bhakta et al. | 365/63 |
| 6,938,119 B2 | 8/2005 | Kohn et al. | 711/105 |
| 6,943,450 B2 | 9/2005 | Fee et al. | |
| 6,944,748 B2 | 9/2005 | Sanches et al. | |
| 6,947,341 B2 | 9/2005 | Stubbs et al. | |
| 6,951,982 B2 | 10/2005 | Chye et al. | |
| 6,952,794 B2 | 10/2005 | Lu | |
| 6,961,281 B2 | 11/2005 | Wong et al. | 365/230.03 |
| 6,968,416 B2 | 11/2005 | Moy | 710/310 |
| 6,968,419 B1 | 11/2005 | Holman | 711/5 |
| 6,970,968 B1 | 11/2005 | Holman | 711/5 |
| 6,980,021 B1 | 12/2005 | Srivastava et al. | 326/30 |
| 6,986,118 B2 | 1/2006 | Dickman | 716/8 |
| 6,992,501 B2 | 1/2006 | Rapport | 326/30 |
| 6,992,950 B2 | 1/2006 | Foss et al. | 365/233 |
| 7,000,062 B2 | 2/2006 | Perego et al. | 711/5 |
| 7,003,618 B2 | 2/2006 | Perego et al. | 711/5 |
| 7,003,639 B2 | 2/2006 | Tsern et al. | 711/154 |
| 7,007,095 B2 | 2/2006 | Chen et al. | |
| 7,007,175 B2 | 2/2006 | Chang et al. | 713/300 |
| 7,010,642 B2 | 3/2006 | Perego et al. | 711/5 |
| 7,010,736 B1 | 3/2006 | Teh et al. | 714/733 |
| 7,024,518 B2 | 4/2006 | Halbert et al. | 711/115 |
| 7,026,708 B2 | 4/2006 | Caty et al. | 257/686 |
| 7,028,215 B2 | 4/2006 | Depew et al. | |
| 7,028,234 B2 | 4/2006 | Huckaby et al. | 714/710 |
| 7,033,861 B1 | 4/2006 | Partridge et al. | 438/109 |
| 7,035,150 B2 | 4/2006 | Streif et al. | 365/194 |
| 7,043,599 B1 | 5/2006 | Ware et al. | 711/106 |
| 7,043,611 B2 | 5/2006 | McClannahan et al. | |
| 7,045,396 B2 | 5/2006 | Crowley et al. | |
| 7,045,901 B2 | 5/2006 | Lin et al. | 257/778 |
| 7,046,538 B2 | 5/2006 | Kinsley et al. | 365/52 |
| 7,053,470 B1 | 5/2006 | Sellers et al. | 257/768 |
| 7,053,478 B2 | 5/2006 | Roper et al. | 257/686 |
| 7,058,776 B2 | 6/2006 | Lee | 711/167 |
| 7,058,863 B2 | 6/2006 | Kouchi et al. | 714/718 |
| 7,061,784 B2 | 6/2006 | Jakobs et al. | 365/51 |
| 7,061,823 B2 | 6/2006 | Faue et al. | 365/230.08 |
| 7,066,741 B2 | 6/2006 | Burns et al. | 439/69 |
| 7,075,175 B2 | 7/2006 | Kazi et al. | 257/678 |
| 7,079,396 B2 | 7/2006 | Gates et al. | |
| 7,079,441 B1 | 7/2006 | Partsch et al. | 365/226 |
| 7,079,446 B2 | 7/2006 | Murtagh et al. | 365/233 |
| 7,085,152 B2 | 8/2006 | Ellis et al. | 365/149 |
| 7,085,941 B2 | 8/2006 | Li | 713/300 |
| 7,089,438 B2 | 8/2006 | Raad | 713/322 |
| 7,093,101 B2 | 8/2006 | Aasheim et al. | 711/207 |
| 7,103,730 B2 | 9/2006 | Saxena et al. | 711/156 |
| 7,110,322 B2 | 9/2006 | Farmwald et al. | |
| 7,111,143 B2 | 9/2006 | Walker | |
| 7,117,309 B2 | 10/2006 | Bearden | |
| 7,119,428 B2 | 10/2006 | Tanie et al. | |
| 7,120,727 B2 | 10/2006 | Lee et al. | 711/5 |
| 7,126,399 B1 | 10/2006 | Lee | 327/261 |
| 7,127,567 B2 | 10/2006 | Ramakrishnan et al. | |
| 7,133,960 B1 | 11/2006 | Thompson et al. | 711/5 |
| 7,136,978 B2 | 11/2006 | Miura et al. | 711/165 |
| 7,138,823 B2 | 11/2006 | Janzen et al. | |
| 7,149,145 B2 | 12/2006 | Kim et al. | 365/233 |
| 7,149,824 B2 | 12/2006 | Johnson | 710/35 |
| 7,173,863 B2 | 2/2007 | Conley et al. | 365/189 |
| 7,200,021 B2 | 4/2007 | Raghuram | 365/51 |
| 7,205,789 B1 | 4/2007 | Karabatsos | 326/30 |
| 7,210,059 B2 | 4/2007 | Jeddeloh | |
| 7,215,561 B2 | 5/2007 | Park et al. | |
| 7,218,566 B1 | 5/2007 | Totolos, Jr. et al. | |
| 7,224,595 B2 | 5/2007 | Dreps et al. | 365/63 |
| 7,228,264 B2 | 6/2007 | Barrenscheen et al. | 703/23 |
| 7,231,562 B2 | 6/2007 | Ohlhoff et al. | |
| 7,233,541 B2 | 6/2007 | Yamamoto et al. | 365/230.03 |
| 7,234,081 B2 | 6/2007 | Nguyen et al. | |
| 7,243,185 B2 | 7/2007 | See et al. | |
| 7,245,541 B2 | 7/2007 | Janzen | 365/198 |
| 7,254,036 B2 | 8/2007 | Pauley et al. | 361/721 |
| 7,266,639 B2 | 9/2007 | Raghuram | 711/115 |
| 7,269,042 B2 | 9/2007 | Kinsley et al. | 365/52 |
| 7,269,708 B2 | 9/2007 | Ware | 711/203 |
| 7,274,583 B2 | 9/2007 | Park et al. | |

(56) References Cited

U.S. PATENT DOCUMENTS

| | | | |
|---|---|---|---|
| 7,277,333 B2 | 10/2007 | Schaefer | |
| 7,286,436 B2 | 10/2007 | Bhakta et al. | 365/230 |
| 7,289,386 B2 | 10/2007 | Bhakta et al. | 365/230 |
| 7,296,754 B2 | 11/2007 | Nishizawa et al. | 235/492 |
| 7,299,330 B2 | 11/2007 | Gillingham et al. | 711/167 |
| 7,302,598 B2 | 11/2007 | Suzuki et al. | |
| 7,307,863 B2 | 12/2007 | Yen et al. | 365/63 |
| 7,317,250 B2 | 1/2008 | Koh et al. | |
| 7,327,613 B2 | 2/2008 | Lee | |
| 7,336,490 B2 | 2/2008 | Harris et al. | |
| 7,337,293 B2 | 2/2008 | Brittain et al. | |
| 7,363,422 B2 | 4/2008 | Perego et al. | 711/105 |
| 7,366,947 B2 | 4/2008 | Gower et al. | |
| 7,379,316 B2 | 5/2008 | Rajan | 365/63 |
| 7,386,656 B2 | 6/2008 | Rajan et al. | 711/103 |
| 7,392,338 B2 | 6/2008 | Rajan et al. | 711/103 |
| 7,408,393 B1 | 8/2008 | Jain et al. | 327/202 |
| 7,409,492 B2 | 8/2008 | Tanaka et al. | 711/103 |
| 7,414,917 B2 | 8/2008 | Ruckerbauer et al. | |
| 7,428,644 B2 | 9/2008 | Jeddeloh et al. | |
| 7,437,579 B2 | 10/2008 | Jeddeloh et al. | 713/300 |
| 7,441,064 B2 | 10/2008 | Gaskins | |
| 7,457,122 B2 | 11/2008 | Lai et al. | |
| 7,464,225 B2 | 12/2008 | Tsern | 711/115 |
| 7,472,220 B2 | 12/2008 | Rajan et al. | 711/103 |
| 7,474,576 B2 | 1/2009 | Co et al. | |
| 7,480,147 B2 | 1/2009 | Hoss et al. | |
| 7,480,774 B2 | 1/2009 | Ellis et al. | |
| 7,496,777 B2 | 2/2009 | Kapil | 713/324 |
| 7,499,281 B2 | 3/2009 | Harris et al. | |
| 7,515,453 B2 | 4/2009 | Rajan | 365/63 |
| 7,532,537 B2 | 5/2009 | Solomon et al. | 365/230 |
| 7,539,800 B2 | 5/2009 | Dell et al. | |
| 7,573,136 B2 | 8/2009 | Jiang et al. | |
| 7,580,312 B2 | 8/2009 | Rajan et al. | |
| 7,581,121 B2 | 8/2009 | Barth et al. | |
| 7,581,127 B2 | 8/2009 | Rajan et al. | |
| 7,590,796 B2 | 9/2009 | Rajan et al. | |
| 7,599,205 B2 | 10/2009 | Rajan | |
| 7,606,245 B2 | 10/2009 | Ma et al. | |
| 7,609,567 B2 | 10/2009 | Rajan et al. | |
| 7,613,880 B2 | 11/2009 | Miura et al. | |
| 7,619,912 B2 | 11/2009 | Bhakta et al. | |
| 7,724,589 B2 | 5/2010 | Rajan et al. | |
| 7,730,338 B2 | 6/2010 | Rajan et al. | |
| 7,738,252 B2 | 6/2010 | Schuette et al. | |
| 7,761,724 B2 | 7/2010 | Rajan et al. | |
| 7,791,889 B2 | 9/2010 | Belady et al. | |
| 7,911,798 B2 | 3/2011 | Chang et al. | |
| 7,934,070 B2 | 4/2011 | Brittain et al. | |
| 7,990,797 B2 | 8/2011 | Moshayedi et al. | |
| 8,116,144 B2 | 2/2012 | Shaw et al. | |
| 2001/0000822 A1 | 5/2001 | Dell et al. | 711/170 |
| 2001/0003198 A1 | 6/2001 | Wu | |
| 2001/0011322 A1 | 8/2001 | Stolt et al. | |
| 2001/0019509 A1 | 9/2001 | Aho et al. | |
| 2001/0021106 A1 | 9/2001 | Weber et al. | 361/790 |
| 2001/0021137 A1 | 9/2001 | Kai et al. | 365/222 |
| 2001/0046129 A1 | 11/2001 | Broglia et al. | |
| 2001/0046163 A1 | 11/2001 | Yaganawa | |
| 2001/0052062 A1 | 12/2001 | Lipovski | |
| 2002/0002662 A1 | 1/2002 | Olarig et al. | |
| 2002/0004897 A1 | 1/2002 | Kao et al. | |
| 2002/0015340 A1 | 2/2002 | Batinovich | |
| 2002/0019961 A1 | 2/2002 | Blodgett | 714/718 |
| 2002/0034068 A1 | 3/2002 | Weber et al. | 361/790 |
| 2002/0038405 A1 | 3/2002 | Leddige et al. | 711/115 |
| 2002/0040416 A1 | 4/2002 | Tsern et al. | |
| 2002/0041507 A1 | 4/2002 | Woo et al. | 365/51 |
| 2002/0051398 A1 | 5/2002 | Mizugaki | 365/222 |
| 2002/0060945 A1 | 5/2002 | Ikeda | |
| 2002/0060948 A1 | 5/2002 | Chang et al. | |
| 2002/0064073 A1 | 5/2002 | Chien | 365/200 |
| 2002/0064083 A1 | 5/2002 | Ryu et al. | 365/233 |
| 2002/0089831 A1 | 7/2002 | Forthun | 361/760 |
| 2002/0089970 A1 | 7/2002 | Asada et al. | |
| 2002/0094671 A1 | 7/2002 | Distefano et al. | |
| 2002/0121650 A1* | 9/2002 | Minamio et al. | 257/200 |
| 2002/0121670 A1* | 9/2002 | Minamio et al. | 257/459 |
| 2002/0124195 A1 | 9/2002 | Nizar | 713/320 |
| 2002/0129204 A1 | 9/2002 | Leighnor et al. | |
| 2002/0145900 A1 | 10/2002 | Schaefer | 365/52 |
| 2002/0165706 A1 | 11/2002 | Raynham | 703/25 |
| 2002/0167092 A1 | 11/2002 | Fee et al. | |
| 2002/0172024 A1 | 11/2002 | Hui et al. | |
| 2002/0174274 A1 | 11/2002 | Wu et al. | 710/100 |
| 2002/0184438 A1 | 12/2002 | Usui | 711/106 |
| 2003/0002262 A1 | 1/2003 | Benisek et al. | 361/728 |
| 2003/0011993 A1 | 1/2003 | Summers et al. | |
| 2003/0016550 A1 | 1/2003 | Yoo et al. | |
| 2003/0021175 A1 | 1/2003 | Tae Kwak | 365/219 |
| 2003/0026155 A1 | 2/2003 | Yamagata | |
| 2003/0026159 A1 | 2/2003 | Frankowsky et al. | |
| 2003/0035312 A1 | 2/2003 | Halbert et al. | 365/51 |
| 2003/0039158 A1 | 2/2003 | Horiguchi et al. | 365/200 |
| 2003/0041295 A1 | 2/2003 | Hou et al. | |
| 2003/0061458 A1 | 3/2003 | Wilcox et al. | 711/167 |
| 2003/0061459 A1 | 3/2003 | Aboulenein et al. | |
| 2003/0083855 A1 | 5/2003 | Fukuyama | |
| 2003/0088743 A1 | 5/2003 | Rader | |
| 2003/0093614 A1 | 5/2003 | Kohn et al. | 711/105 |
| 2003/0101392 A1 | 5/2003 | Lee | 714/718 |
| 2003/0105932 A1 | 6/2003 | David et al. | 711/167 |
| 2003/0110339 A1 | 6/2003 | Calvignac et al. | |
| 2003/0117875 A1 | 6/2003 | Lee et al. | 365/226 |
| 2003/0123389 A1 | 7/2003 | Russell et al. | |
| 2003/0126338 A1 | 7/2003 | Dodd et al. | 710/305 |
| 2003/0127737 A1 | 7/2003 | Takahashi | |
| 2003/0131160 A1 | 7/2003 | Hampel et al. | 710/22 |
| 2003/0145163 A1 | 7/2003 | Seo et al. | 711/106 |
| 2003/0158995 A1 | 8/2003 | Lee et al. | 711/105 |
| 2003/0164539 A1 | 9/2003 | Yau | 257/686 |
| 2003/0164543 A1 | 9/2003 | Kheng Lee | |
| 2003/0174569 A1 | 9/2003 | Amidi | |
| 2003/0182513 A1 | 9/2003 | Dodd et al. | 711/137 |
| 2003/0183934 A1 | 10/2003 | Barrett | 257/738 |
| 2003/0189868 A1 | 10/2003 | Riesenman et al. | 365/226 |
| 2003/0189870 A1 | 10/2003 | Wilcox | 365/233 |
| 2003/0191888 A1 | 10/2003 | Klein | 711/105 |
| 2003/0191915 A1 | 10/2003 | Saxena et al. | 711/160 |
| 2003/0200382 A1 | 10/2003 | Wells et al. | 711/106 |
| 2003/0200474 A1 | 10/2003 | Li | 713/320 |
| 2003/0205802 A1 | 11/2003 | Segaram | 257/690 |
| 2003/0206476 A1 | 11/2003 | Joo | 365/222 |
| 2003/0217303 A1 | 11/2003 | Chua-Eoan et al. | 713/600 |
| 2003/0223290 A1 | 12/2003 | Park et al. | 365/200 |
| 2003/0227798 A1 | 12/2003 | Pax | 365/189.12 |
| 2003/0229821 A1 | 12/2003 | Ma | 714/8 |
| 2003/0230801 A1 | 12/2003 | Jiang et al. | |
| 2003/0231540 A1 | 12/2003 | Lazar et al. | 365/222 |
| 2003/0231542 A1 | 12/2003 | Zaharinova-Papazova et al. | 365/226 |
| 2003/0234664 A1 | 12/2003 | Yamagata | |
| 2004/0016994 A1* | 1/2004 | Huang | 257/676 |
| 2004/0027902 A1 | 2/2004 | Ooishi et al. | 365/222 |
| 2004/0034732 A1 | 2/2004 | Valin et al. | 711/4 |
| 2004/0034755 A1 | 2/2004 | LaBerge et al. | |
| 2004/0037133 A1 | 2/2004 | Park et al. | 365/202 |
| 2004/0042503 A1 | 3/2004 | Shaeffer et al. | |
| 2004/0044808 A1 | 3/2004 | Salmon et al. | 710/8 |
| 2004/0047228 A1 | 3/2004 | Chen | 365/232 |
| 2004/0049624 A1 | 3/2004 | Salmonsen | |
| 2004/0057317 A1 | 3/2004 | Schaefer | 365/222 |
| 2004/0064647 A1 | 4/2004 | DeWhitt et al. | 711/135 |
| 2004/0064767 A1 | 4/2004 | Huckaby et al. | 714/710 |
| 2004/0083324 A1 | 4/2004 | Rabinovitz et al. | |
| 2004/0088475 A1 | 5/2004 | Streif et al. | 711/105 |
| 2004/0100837 A1 | 5/2004 | Lee | |
| 2004/0117723 A1 | 6/2004 | Foss | 714/805 |
| 2004/0123173 A1 | 6/2004 | Emberling et al. | 714/733 |
| 2004/0125635 A1 | 7/2004 | Kuzmenka | 365/51 |
| 2004/0133736 A1 | 7/2004 | Kyung | 711/105 |
| 2004/0139359 A1 | 7/2004 | Samson et al. | 713/320 |
| 2004/0145963 A1 | 7/2004 | Byon | 365/233 |

(56) References Cited

U.S. PATENT DOCUMENTS

| | | | |
|---|---|---|---|
| 2004/0151038 A1 | 8/2004 | Ruckerbauer et al. | 365/200 |
| 2004/0174765 A1 | 9/2004 | Seo et al. | 365/233 |
| 2004/0177079 A1 | 9/2004 | Gluhovsky et al. | 707/100 |
| 2004/0178824 A1 | 9/2004 | Pan | 326/93 |
| 2004/0184324 A1 | 9/2004 | Pax | 365/189.12 |
| 2004/0186956 A1 | 9/2004 | Perego et al. | 711/115 |
| 2004/0188704 A1 | 9/2004 | Halbert et al. | 257/145 |
| 2004/0195682 A1 | 10/2004 | Kimura | |
| 2004/0196732 A1 | 10/2004 | Lee | 365/233 |
| 2004/0205433 A1 | 10/2004 | Gower et al. | |
| 2004/0208173 A1 | 10/2004 | Di Gregorio | 370/360 |
| 2004/0225858 A1 | 11/2004 | Brueggen | |
| 2004/0228166 A1 | 11/2004 | Braun et al. | 365/154 |
| 2004/0228196 A1 | 11/2004 | Kwak et al. | |
| 2004/0228203 A1 | 11/2004 | Koo | 365/233 |
| 2004/0230932 A1 | 11/2004 | Dickmann | 716/10 |
| 2004/0236877 A1 | 11/2004 | Burton | |
| 2004/0250989 A1 | 12/2004 | Im et al. | |
| 2004/0256638 A1 | 12/2004 | Perego et al. | 257/200 |
| 2004/0257847 A1 | 12/2004 | Matsui et al. | 365/63 |
| 2004/0257857 A1 | 12/2004 | Yamamoto et al. | |
| 2004/0260957 A1 | 12/2004 | Jeddeloh et al. | 713/300 |
| 2004/0264255 A1 | 12/2004 | Royer | 365/189.01 |
| 2004/0268161 A1 | 12/2004 | Ross | 713/300 |
| 2005/0018495 A1 | 1/2005 | Bhakta et al. | 365/19 |
| 2005/0021874 A1 | 1/2005 | Georgiou et al. | 709/250 |
| 2005/0024963 A1 | 2/2005 | Jakobs et al. | 365/202 |
| 2005/0027928 A1 | 2/2005 | Avraham et al. | 711/103 |
| 2005/0028038 A1 | 2/2005 | Pomaranski et al. | 714/42 |
| 2005/0034004 A1 | 2/2005 | Bunker et al. | |
| 2005/0036350 A1 | 2/2005 | So et al. | 365/63 |
| 2005/0041504 A1 | 2/2005 | Perego et al. | 365/222 |
| 2005/0044302 A1 | 2/2005 | Pauley et al. | |
| 2005/0044303 A1 | 2/2005 | Perego et al. | 711/5 |
| 2005/0044305 A1 | 2/2005 | Jakobs et al. | 711/105 |
| 2005/0047192 A1 | 3/2005 | Matsui et al. | 365/145 |
| 2005/0071543 A1 | 3/2005 | Ellis et al. | 711/106 |
| 2005/0078532 A1 | 4/2005 | Ruckerbauer et al. | 365/199 |
| 2005/0081085 A1 | 4/2005 | Ellis et al. | 714/5 |
| 2005/0086548 A1 | 4/2005 | Haid et al. | |
| 2005/0099834 A1 | 5/2005 | Funaba et al. | 365/63 |
| 2005/0102590 A1 | 5/2005 | Norris et al. | 714/719 |
| 2005/0105318 A1 | 5/2005 | Funaba et al. | 365/63 |
| 2005/0108460 A1 | 5/2005 | David | |
| 2005/0127531 A1 | 6/2005 | Tay et al. | |
| 2005/0132158 A1 | 6/2005 | Hampel et al. | 711/167 |
| 2005/0135176 A1 | 6/2005 | Ramakrishnan et al. | |
| 2005/0138267 A1 | 6/2005 | Bains et al. | 711/100 |
| 2005/0138304 A1 | 6/2005 | Ramakrishnan et al. | |
| 2005/0139977 A1 | 6/2005 | Nishio et al. | |
| 2005/0141199 A1 | 6/2005 | Chiou et al. | 361/704 |
| 2005/0149662 A1 | 7/2005 | Perego et al. | 711/5 |
| 2005/0152212 A1 | 7/2005 | Yang et al. | 365/233 |
| 2005/0156934 A1 | 7/2005 | Perego et al. | 345/531 |
| 2005/0166026 A1 | 7/2005 | Ware et al. | 711/167 |
| 2005/0193163 A1 | 9/2005 | Perego et al. | 711/105 |
| 2005/0193183 A1 | 9/2005 | Barth et al. | |
| 2005/0194676 A1* | 9/2005 | Fukuda et al. | 257/698 |
| 2005/0194991 A1 | 9/2005 | Dour et al. | 326/30 |
| 2005/0195629 A1 | 9/2005 | Leddige et al. | 365/51 |
| 2005/0201063 A1 | 9/2005 | Lee et al. | |
| 2005/0204111 A1 | 9/2005 | Natarajan | 711/167 |
| 2005/0207255 A1 | 9/2005 | Perego et al. | 365/222 |
| 2005/0210196 A1 | 9/2005 | Perego et al. | 711/105 |
| 2005/0223179 A1 | 10/2005 | Perego et al. | 711/154 |
| 2005/0224948 A1 | 10/2005 | Lee et al. | 257/686 |
| 2005/0232049 A1 | 10/2005 | Park | |
| 2005/0235119 A1 | 10/2005 | Sechrest et al. | 711/158 |
| 2005/0235131 A1 | 10/2005 | Ware | 711/203 |
| 2005/0237838 A1 | 10/2005 | Kwak et al. | 365/222 |
| 2005/0243635 A1 | 11/2005 | Schaefer | |
| 2005/0246558 A1 | 11/2005 | Ku | |
| 2005/0249011 A1 | 11/2005 | Maeda | 365/222 |
| 2005/0259504 A1 | 11/2005 | Murtugh et al. | 365/233 |
| 2005/0263312 A1 | 12/2005 | Bolken et al. | |
| 2005/0265506 A1 | 12/2005 | Foss et al. | 375/376 |
| 2005/0269715 A1 | 12/2005 | Yoo | 257/780 |
| 2005/0278474 A1 | 12/2005 | Perersen et al. | 711/5 |
| 2005/0281096 A1 | 12/2005 | Bhakta et al. | |
| 2005/0281123 A1 | 12/2005 | Bell et al. | 365/230.08 |
| 2005/0283572 A1 | 12/2005 | Ishihara | 711/118 |
| 2005/0285174 A1 | 12/2005 | Saito et al. | 257/296 |
| 2005/0286334 A1 | 12/2005 | Saito et al. | |
| 2005/0289292 A1 | 12/2005 | Morrow et al. | 711/105 |
| 2005/0289317 A1 | 12/2005 | Liou et al. | 711/170 |
| 2006/0002201 A1 | 1/2006 | Janzen | 365/191 |
| 2006/0010339 A1 | 1/2006 | Klein | 714/5 |
| 2006/0026484 A1 | 2/2006 | Hollums | 714/746 |
| 2006/0038597 A1 | 2/2006 | Becker et al. | |
| 2006/0039204 A1 | 2/2006 | Cornelius | |
| 2006/0039205 A1 | 2/2006 | Cornelius | 365/189.05 |
| 2006/0041711 A1 | 2/2006 | Miura et al. | 711/103 |
| 2006/0041730 A1 | 2/2006 | Larson | |
| 2006/0044909 A1 | 3/2006 | Kinsley et al. | 365/222 |
| 2006/0044913 A1 | 3/2006 | Klein et al. | 365/222 |
| 2006/0049502 A1 | 3/2006 | Goodwin et al. | 257/686 |
| 2006/0050574 A1 | 3/2006 | Streif et al. | 365/194 |
| 2006/0056244 A1 | 3/2006 | Ware | 365/194 |
| 2006/0062047 A1 | 3/2006 | Bhakta et al. | |
| 2006/0067141 A1 | 3/2006 | Perego et al. | 365/200 |
| 2006/0085616 A1 | 4/2006 | Zeighami et al. | |
| 2006/0087900 A1 | 4/2006 | Bucksch et al. | |
| 2006/0090031 A1 | 4/2006 | Kirshenbaum et al. | 711/113 |
| 2006/0090054 A1 | 4/2006 | Choi et al. | 711/167 |
| 2006/0106951 A1 | 5/2006 | Bains | 710/5 |
| 2006/0112214 A1 | 5/2006 | Yeh | 711/103 |
| 2006/0112219 A1 | 5/2006 | Chawla et al. | |
| 2006/0117152 A1 | 6/2006 | Amidi et al. | 711/154 |
| 2006/0117160 A1 | 6/2006 | Jackson et al. | 711/170 |
| 2006/0118933 A1 | 6/2006 | Haba | |
| 2006/0120193 A1 | 6/2006 | Casper | 365/222 |
| 2006/0123265 A1 | 6/2006 | Ruckerbauer et al. | 713/500 |
| 2006/0126369 A1 | 6/2006 | Raghuram | 365/51 |
| 2006/0129712 A1 | 6/2006 | Raghuram | 710/52 |
| 2006/0129740 A1 | 6/2006 | Ruckerbauer et al. | |
| 2006/0129755 A1 | 6/2006 | Raghuram | 711/105 |
| 2006/0133173 A1 | 6/2006 | Jain et al. | 365/222 |
| 2006/0136791 A1 | 6/2006 | Nierle | |
| 2006/0149857 A1 | 7/2006 | Holman | |
| 2006/0149982 A1 | 7/2006 | Vogt | 713/320 |
| 2006/0174082 A1 | 8/2006 | Bellows et al. | |
| 2006/0176744 A1 | 8/2006 | Stave | 365/194 |
| 2006/0179262 A1 | 8/2006 | Brittain et al. | |
| 2006/0179333 A1 | 8/2006 | Brittain et al. | 713/320 |
| 2006/0179334 A1 | 8/2006 | Brittain et al. | 713/320 |
| 2006/0180926 A1 | 8/2006 | Mullen et al. | |
| 2006/0181953 A1 | 8/2006 | Rotenberg et al. | 365/230.06 |
| 2006/0195631 A1 | 8/2006 | Rajamani | |
| 2006/0198178 A1 | 9/2006 | Kinsley et al. | 365/52 |
| 2006/0203590 A1 | 9/2006 | Mori et al. | 365/222 |
| 2006/0206738 A1 | 9/2006 | Jeddeloh et al. | 713/320 |
| 2006/0233012 A1 | 10/2006 | Sekiguchi et al. | |
| 2006/0236165 A1 | 10/2006 | Cepulis et al. | |
| 2006/0236201 A1 | 10/2006 | Gower et al. | |
| 2006/0248261 A1 | 11/2006 | Jacob et al. | |
| 2006/0248387 A1 | 11/2006 | Nicholson et al. | 714/22 |
| 2006/0262586 A1 | 11/2006 | Solomon et al. | |
| 2006/0262587 A1 | 11/2006 | Matsui et al. | |
| 2006/0277355 A1 | 12/2006 | Ellsberry et al. | |
| 2006/0294295 A1 | 12/2006 | Fukuzo | 711/105 |
| 2007/0005998 A1 | 1/2007 | Jain et al. | |
| 2007/0050530 A1 | 3/2007 | Rajan | 711/5 |
| 2007/0058471 A1 | 3/2007 | Rajan et al. | 365/222 |
| 2007/0070669 A1 | 3/2007 | Tsern | |
| 2007/0088995 A1 | 4/2007 | Tsern et al. | |
| 2007/0091696 A1 | 4/2007 | Niggemeier et al. | |
| 2007/0106860 A1 | 5/2007 | Foster, Sr. et al. | 711/170 |
| 2007/0136537 A1 | 6/2007 | Doblar et al. | |
| 2007/0152313 A1 | 7/2007 | Periaman et al. | |
| 2007/0162700 A1 | 7/2007 | Fortin et al. | 711/118 |
| 2007/0188997 A1 | 8/2007 | Hockanson et al. | |
| 2007/0192563 A1 | 8/2007 | Rajan et al. | 711/202 |
| 2007/0195613 A1 | 8/2007 | Rajan et al. | 365/189.05 |
| 2007/0204075 A1 | 8/2007 | Rajan et al. | |

(56) References Cited

U.S. PATENT DOCUMENTS

| | | | |
|---|---|---|---|
| 2007/0216445 A1 | 9/2007 | Raghavan et al. | 326/83 |
| 2007/0247194 A1 | 10/2007 | Jain | 326/87 |
| 2007/0279084 A1 | 12/2007 | Oh et al. | |
| 2007/0285895 A1 | 12/2007 | Gruendler et al. | |
| 2007/0288683 A1 | 12/2007 | Panabaker et al. | 711/101 |
| 2007/0288686 A1 | 12/2007 | Arcedera et al. | 711/103 |
| 2007/0288687 A1 | 12/2007 | Panabaker et al. | 711/103 |
| 2007/0290333 A1 | 12/2007 | Saini et al. | |
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0034130 A1 | 2/2008 | Perego et al. | |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | 711/105 |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | 711/105 |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 711/105 |
| 2008/0126692 A1 | 5/2008 | Rajan et al. | |
| 2008/0130364 A1 | 6/2008 | Guterman et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0195894 A1 | 8/2008 | Schreck et al. | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2008/0282084 A1 | 11/2008 | Hatakeyama | |
| 2008/0282341 A1 | 11/2008 | Hatakeyama | |
| 2009/0024789 A1 | 1/2009 | Rajan et al. | |
| 2009/0024790 A1 | 1/2009 | Rajan et al. | |
| 2009/0049266 A1 | 2/2009 | Kuhne | |
| 2009/0063865 A1 | 3/2009 | Berenbaum et al. | |
| 2009/0063896 A1 | 3/2009 | Lastras-Montano et al. | |
| 2009/0070520 A1 | 3/2009 | Mizushima | |
| 2009/0089480 A1 | 4/2009 | Wah et al. | |
| 2009/0109613 A1 | 4/2009 | Legen et al. | |
| 2009/0180926 A1 | 7/2009 | Petruno et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |

FOREIGN PATENT DOCUMENTS

| | | | |
|---|---|---|---|
| DE | 102005036528 | 2/2007 | G11C 7/10 |
| EP | 0644547 | 3/1995 | |
| JP | 62121978 | 6/1987 | G06F 12/06 |
| JP | 01171047 | 7/1989 | G06F 12/16 |
| JP | 03-029357 | 2/1991 | H01L 27/04 |
| JP | 03029357 | 2/1991 | H01L 21/822 |
| JP | 03/276487 | 12/1991 | G11C 11/401 |
| JP | 03286234 | 12/1991 | G06F 12/06 |
| JP | 05-298192 | 11/1993 | |
| JP | 07-141870 | 6/1995 | G11C 11/407 |
| JP | 08/077097 | 3/1996 | G06F 13/16 |
| JP | 08077097 | 3/1996 | G06F 12/00 |
| JP | 11-149775 | 6/1999 | G11C 11/407 |
| JP | 2002025255 | 1/2002 | G11C 7/10 |
| JP | 3304893 B2 | 5/2002 | |
| JP | 04-327474 | 11/2004 | |
| JP | 2006236388 | 9/2006 | G06F 12/00 |
| KR | 10200400627817 | 7/2004 | G11C 5/02 |
| KR | 2005120344 | 12/2005 | |
| WO | WO 95/05676 | 2/1995 | H01L 25/00 |
| WO | WO9900734 | 1/1999 | |
| WO | WO00/45270 | 8/2000 | |
| WO | WO01/90900 | 11/2001 | |
| WO | WO0197160 | 12/2001 | |
| WO | WO2004/044754 | 5/2004 | |
| WO | WO2004/051645 | 6/2004 | |
| WO | WO2006/072040 | 7/2006 | |
| WO | WO2007002324 | 1/2007 | G11C 29/00 |
| WO | WO2007/028109 | 3/2007 | |
| WO | WO 2007/003825 | 4/2007 | G01V 5/00 |
| WO | WO2007/095080 | 8/2007 | |
| WO | WO2008063251 | 5/2008 | G11C 5/14 |

OTHER PUBLICATIONS

Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939432 mailed on Feb. 6, 2009.
Wu et al., "eNVy: A Non-Volatile, Main Memory Storage System," ASPLOS-VI Proceedings—Sixth International Conference on Architectural Support for Programming Languages and Operating Systems, San Jose, California, Oct. 4-7, 1994. SIGARCH Computer Architecture News 22(Special Issue Oct. 1994).
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Kellerbauer "Die Schnelle Million," with translation, "The quick million."
Wu et al., "eNVy: A Non-Volatile, Main Memory Storage System," to appear in ASPLOS VI.

(56) References Cited

OTHER PUBLICATIONS

"Using Two Chip Selects to Enable Quad Rank," IP.com PriorArtDatabase, copyright IP.com, Inc. 2004.
"BIOS and Kernel Developer's Guide (BKDG) for AMD Family 10h Processors," AMD, 31116 Rev 3.00, Sep. 7, 2007.
Skerlj et al., "Buffer Device for Memory Modules (DIMM)" Qimonda 2006, p. 1.
Written Opinion from PCT Application No. PCT/US06/24360 mailed on Jan. 8, 2007.
Preliminary Report on Patentability from PCT Application No. PCT/US06/24360 mailed on Jan. 10, 2008.
Written Opinion from International PCT Application No. PCT/US06/34390 mailed on Nov. 21, 2007.
International Search Report from PCT Application No. PCT/US06/34390 mailed on Nov. 21, 2007.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Notice of Allowance from U.S. Appl. No. 11/939,432 Mailed Dec. 1, 2009.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Feb. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from related Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice of Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
English translation of Office Action from co-pending Korean patent application No. KR1020087005172, dated Dec. 20, 2012.
Office Action, including English translation, from co-pending Japanese application No. 2008-529353, Dated Dec. 27, 2012.
Office Action from co-pending European patent application No. EP12150798, Dated Jan. 3, 2013.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Notice of Allowance from U.S. Appl. No. 12/574,628 Dated Mar. 6, 2012.
European Search Report from co-pending European application No. 11194883.2-2212, Dated Apr. 27, 2012.
Non-Final Office Action from U.S. Appl. No. 11/553,372, Dated May 3, 2012.
Notice of Allowance from U.S. Appl. No. 11/929,631, Dated May 3, 2012.
Search Report From PCT Application No. PCT/US10/038041 Dated Aug. 23, 2010.
Non-Final Office Action from U.S. Appl. No. 11/461,437 Dated Jan. 4, 2011.
Notice of Allowance from U.S. Appl. No. 11/515,223 Dated Feb. 4, 2011.
Non-Final Office Action from U.S. Appl. No. 11/553,372 Dated Jan. 5, 2011.

(56) References Cited

OTHER PUBLICATIONS

Final Office Action from U.S. Appl. No. 11/588,739 Dated Dec. 15, 2010.
Notice of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice of Allowance from U.S. Appl. No. 11/939,432 Dated Feb. 18, 2011.
Notice of Allowance from U.S. Appl. No. 12/144,396 Dated Feb. 1, 2011.
Non-Final Office Action from U.S. Appl. No. 12/816,756 Dated Feb. 7, 2011.
Notice of Allowance from U.S. Appl. No. 11/762,013 Dated Feb. 23, 2011.
Notice of Allowance from U.S. Appl. No. 11/929,500 Dated Feb. 24, 2011.
Notice of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from U.S. Appl. No. 11/855,805, Dated May 26, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 13/165,713, Dated May 22, 2012.
Non-Final Office Action from U.S. Appl. No. 12/144,396 Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Office Action from co-pending Japanese patent application No. 2012-132119, Dated Mar. 6, 2013.
Notice of Allowance from U.S. Appl. No. 11/461,435, Dated Mar. 6, 2013.
Notice of Allowance from U.S. Appl. No. 11/515,223, Dated Mar. 18, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
EPO Communication for Co-pending European patent application No. EP11194862.6, dated May 5, 2013.
Non-Final Office Action from U.S. Appl. No. 13/620,793, Dated May 6, 2013.
Non-Final Office Action from U.S. Appl. No. 13/620,565, Dated May 24, 2013.

(56) References Cited

OTHER PUBLICATIONS

Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Non-Final Office Action from U.S. Appl. No. 11/929,655, Dated Jun. 21, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.
Non-Final Office Action from U.S. Appl. No. 12/507,683, Dated Aug. 27, 2013.
Non-Final Office Action from U.S. Appl. No. 13/315,933, Dated Aug. 27, 2013.
Final Office Action from U.S. Appl. No. 13/620,650, Dated Aug. 30, 2013.
Notice of Allowance from U.S. Appl. No. 13/620,424, Dated Sep. 11, 2013.
Non-Final Office Action from U.S. Appl. No. 13/620,291, Dated Sep. 12, 2013.
Notice of Allowance from U.S. Appl. No. 13/341,844, Dated Sep. 17, 2013.
Notice of Allowance from U.S. Appl. No. 13/620,412, dated Sep. 25, 2013.
Non-Final Office Action from U.S. Appl. No. 13/343,852, dated Sep. 27, 2013.
English Translation of Office Action from co-pending Korean patent application No. 10-2008-7019582, dated Sep. 16, 2013.
Notice of Allowance from U.S. Appl. No. 13/620,565, dated Sep. 27, 2013.
Non-Final Office Action from U.S. Appl. No. 13/279,068, dated Sep. 30, 2013.
Notice of Allowance from U.S. Appl. No. 13/620,207, dated Oct. 9, 2013.
Non-Final Office Action from U.S. Appl. No. 13/898,002, dated Oct. 10, 2013.
Notice of Allowance from U.S. Appl. No. 13/471,283, dated Oct. 15, 2013.
Notice of Allowance from U.S. Appl. No. 11/515,223, dated Oct. 24, 2013.
Notice of Allowance from U.S. Appl. No. 13/181,747, dated Oct. 28, 2013.
Notice of Allowance from U.S. Appl. No. 13/597,895, dated Oct. 29, 2013.
Notice of Allowance from U.S. Appl. No. 13/620,199, dated Nov. 13, 2013.
Final Office Action from U.S. Appl. No. 13/620,793, dated Nov. 13, 2013.
Notice of Allowance from U.S. Appl. No. 13/618,246, dated Nov. 14, 2013.
Notice of Allowance from U.S. Appl. No. 13/473,827, dated Nov. 20, 2013.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Notice of Allowance from U.S. Appl. No. 11/515,223 Dated Nov. 29, 2011.
Notice of Allowance from U.S. Appl. No. 12/769,428 Dated Nov. 29, 2011.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action from German Patent Application No. 11 2006 001 810.8-55 Dated Feb. 18, 2009 (With Translation).
Non-Final Office Action from U.S. Appl. No. 11/461,420 Dated Jul. 23, 2009.
Notice of Allowance from U.S. Appl. No. 11/461,430 Dated Sep. 9, 2009.
Non-Final Office Action from U.S. Appl. No. 11/461,435 Dated Aug. 5, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.
Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/763,365 Dated Oct. 28, 2009.
Non-Final Office Action from U.S. Appl. No. 11/858,518 Dated Aug. 14, 2009.
Non-Final Office Action from U.S. Appl. No. 11/929,500 Dated Oct. 13, 2009.

(56) References Cited

OTHER PUBLICATIONS

Notice of Allowance from U.S. Appl. No. 11/939,432 Dated Sep. 24, 2009.
Non-Final Office Action from U.S. Appl. No. 11/941,589 Dated Oct. 1, 2009.
Supplemental European Search Report and Search Opinion issued Sep. 21, 2009 in European Application No. 07870726.2, 8 pages.
Wu et al., "eNVy: A Non-Volatile, Main Memory Storage System", ASPLOS-VI Proceedings, Oct. 4-7, 1994, pp. 86-97.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Final Office Action from U.S. Appl. No. 11/461,435 Dated May 13, 2010.
Notice of Allowance from U.S. Appl. No. 11/515,223 Dated Jul. 30, 2010.
Notice of Allowance from U.S. Appl. No. 11/553,372 Dated Aug. 4, 2010.
Final Office Action from U.S. Appl. No. 11/553,390 Dated Jun. 24, 2010.
Notice of Allowance from U.S. Appl. No. 11/553,399 Dated Dec. 3, 2010.
Notice of Allowance from U.S. Appl. No. 11/611,374 Dated Jul. 19, 2010.
Notice of Allowance from U.S. Appl. No. 11/611,374 Dated Oct. 29, 2010.
Final Office Action from U.S. Appl. No. 11/672,921 Dated Jul. 23, 2010.
Final Office Action from U.S. Appl. No. 11/672,924 Dated Sep. 7, 2010.
Final Office Action from U.S. Appl. No. 11/702,960 Dated Jun. 21, 2010.
Non-Final Office Action from U.S. Appl. No. 11/702,981 Dated Mar. 11, 2009.
Notice of Allowance from U.S. Appl. No. 11/762,010 Dated Jul. 2, 2010.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Notice of Allowance from U.S. Appl. No. 11/763,365 Dated Jun. 29, 2010.
Notice of Allowance from U.S. Appl. No. 11/763,365 Dated Oct. 20, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,500 Dated Jun. 24, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/574,628 Dated Jun. 10, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Office Action, including English translation, from co-pending Japanese application No. 2008-529353, Dated Jul. 31, 2012.
Final Office Action from U.S. Appl. No. 13/315,933, Dated Aug. 24, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from related European application No. 11194876.6-2212/2450798, Dated Apr. 12, 2012.
European Search Report from related European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.

* cited by examiner

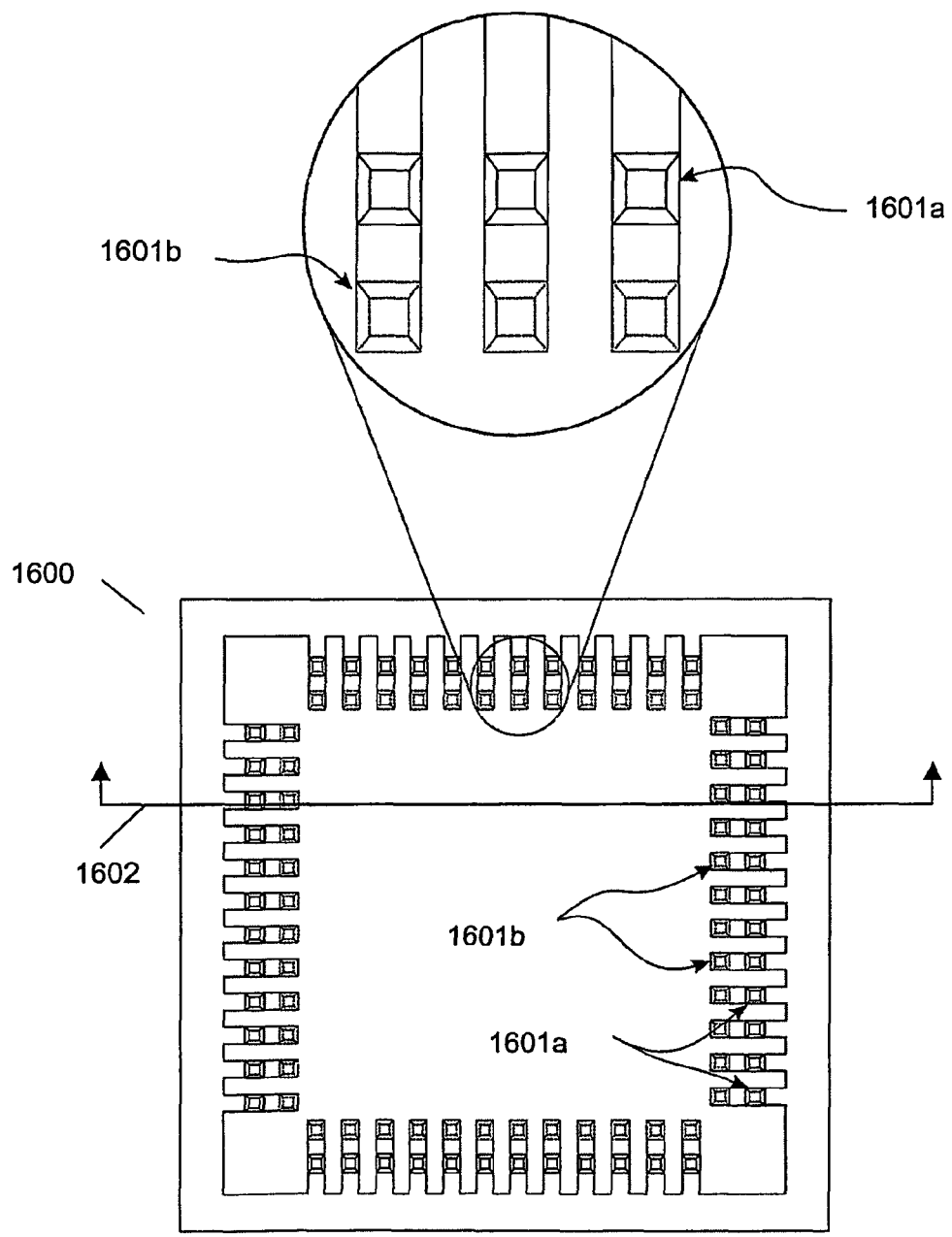
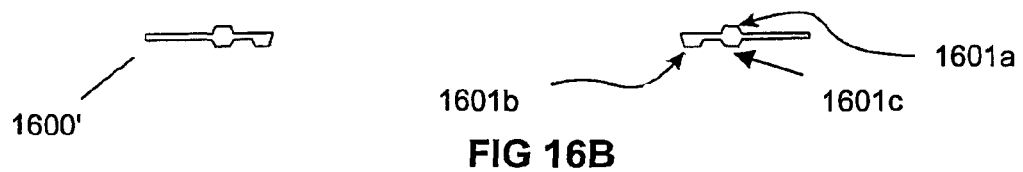
FIG 16A
FIG 16B

STACKABLE LOW-PROFILE LEAD FRAME PACKAGE

BACKGROUND

1. Field of the Invention

This invention is related to the field of integrated circuit packaging and, more particularly to stackable integrated circuit packaging.

2. Description

Over the course of the development of the electronics industry, there has been an endless effort to increase both compactness and the performance of electronics products. The semiconductor devices have increased in terms of the numbers of transistors that can be created in a given space and volume, but it is the semiconductor package that has largely established the lower limits of the size of devices. So called chip scale and chip size packages have served well to meet this challenge by creating input/output (I/O) patterns for interconnection to the next level circuits, which are kept within the perimeter of the die. While this is suitable for making interconnection at near chip size, desire for even greater functionality in the same foot print and area has lead in recent years to increased interest in and to the development of stacked integrated circuit (IC) devices and stacked package assemblies. One area of specific interest and need is in the area of stacked chip assemblies for memory die. Particularly, the cost effectiveness of such solutions is of interest.

Crowley, et al. in U.S. Pat. No. 7,045,396 disclose a lead frame package that is stackable. Moreover, it discloses the use of a paddle which adds to package thickness and increases the package cross section profile. This is not suitable for applications wherein height standards must be met while stacking larger numbers of die (for example an eight high package stack), while still allowing for sufficient airflow between assemblies for cooling. Another example of a stackable lead frame package is described by Haba in United States Patent Application 2006/0118933 titled: "Stackable frames for packaging microelectronic devices". Again the structure is not suitable for low profile stacking.

Huang discloses in U.S. Pat. No. 6,630,729 another approach to creating a stacked lead frame structure wherein the thickness of the lead frame establishes the thickness of the assembly and the lead frame is stacked.

Chye, et al in U.S. Pat. No. 6,951,982 disclose another approach to for a two stack lead frame integrated circuit (IC) package wherein the lower package has long leads and the upper package has short leads for connecting to the upper surface of the longer leads of the lower lead frame package.

Fee, et al. in U.S. Pat. No. 6,943,450 also disclose a stackable lead frame IC package.

Lyu, et al. in U.S. Pat. No. 6,878,570 disclose a method for stack assembly of lead frame packages.

Beyond the desire to provide for stacking, a feature for lead frame packages having small I/O terminals is that they have a design element such as lead features which allow for reliable capture of the lead in the resin and which will prevent the inadvertent removal of the leads from the encapsulant. An example of such is the rivet like contact is described in U.S. Pat. No. 6,001,671.

Methods used in the fabrication of lead frame packages having small terminals are known by those skilled in the art. For example, typical four sided flat or two sided flat type semiconductor packages, such as bottom lead type (e.g. quad flat no-lead (QFN)) or lead end grid array type semiconductor packages, can be fabricated using a method which may involve, for example, a sawing step for cutting up a semiconductor wafer having a plurality of semiconductor ICs into individual die. This is followed by a semiconductor die mounting step where the semiconductor die is joined to the paddles of lead frame die site and integrally formed on to the lead frame strip by means of a thermally-conductive adhesive resin. This step is followed by a wire bonding step where the innermost ends of the lead frame (i.e. closest to the die) are electrically connected to an associated I/O terminal of the semiconductor die. Next a resin encapsulation or molding step is performed to encapsulate each semiconductor die assembly including bonding wires for the semiconductor die and lead frame assembly. Next is a singulation step where the I/O leads and paddle connections of each lead frame unit are cut proximate to the lead frame to separate the semiconductor package assemblies from one another. These separated devices can be marked, tested and burned in to assure their quality. Depending on the lead frame design, the leads may be formed into a so-called "J-lead" or "gull wing" configuration. However when fabricating a bottom lead type or short peripherally leaded type semiconductor packages, the lead forming step is omitted. Instead, the lower surface or free end of each lead is exposed at the bottom of the encapsulation and the exposed portion of each lead may be used as an external I/O terminal for use with a socket or for attachment to a PCB with joining material such as a tin alloy solder. A semiconductor package structure created by the process just described can be seen in FIG. 1.

FIG. 1 also identifies the most basic elements of such a semiconductor IC package. The semiconductor IC package 100 includes a semiconductor die 101 bonded to a paddle 102 by means of a thermally-conductive epoxy resin 103 and a plurality of I/O leads 104 are arranged at each of either two or four sides of the paddle. The arrangement of the leads is laid out such that the leads are spaced apart from the side of the paddle while extending perpendicularly to the associated side of the paddle. The semiconductor package also includes a plurality of conductive wires 105 for electrically connecting the inner lead bond locations 107 to the semiconductor die bond sites 106, respectively, and a resin encapsulate 108 for encapsulating the semiconductor die and conductive wires. The semiconductor package further includes outer leads extending outwardly from the inner lead bond locations, respectively. The outer leads may have a particular shape such as a "J-lead" shape or a planar bottom lead shape, as shown. These outer leads serve to make interconnection to the next level assembly such as a PCB.

FIGS. 2 A-D shows various lead frame package configurations specifically designed for stacking or slightly modified to allow for stacking. FIG. 2A shows an example of a lead frame with a J or C shape allowing soldering from one lead to the other in the same foot print. FIG. 2B shows an example of a straight lead semiconductor package in stacked form. The leads could also be shaped in a "gull wing" form if desired. FIG. 2C shows another example of a lead frame structure where the lead frame is accessed from top and bottom at offset points. This allows for stacking at lower profile, however the foot print is different on the two sides. FIG. 2D shows yet another stacking structure.

FIGS. 3A-3C show example solutions for stacking semiconductor die themselves rather than stacking the assembled packages. Often there is a preparatory step involving the creation of a redistribution circuit layer (RDL), especially in the cases where the die terminations are in the center, such as DRAM die. The RDL is a layer of circuits which interconnect native and primary semiconductor die I/O terminals to secondary I/O terminal locations distal from the original I/O locations.

FIG. 3A shows an example of such a stacked die assembly 300A construction where the central I/O terminals of the die 301 have been redistributed to the edge 302 using a redistribution circuit 303. A connection to each of the die is made at the edge contact using a conductive material 304. Such assemblies could be mounted directly on to PCBs, however they would very difficult to standardize.

FIG. 3B shows a stack die assembly construction 300B designed to overcome this limitation by assembling the stacked die on an interposer 305 to make possible interconnection to a standard registered outline, such as those published by JEDEC (Joint Electronic Device Council a division of the American Electronics Association).

FIG. 3C shows another example of a stacked die assembly package 300C where the semiconductor die 306 are interconnected to a common base substrate 307 by means of wire bonds 308. The semiconductor dice are separated by spacers 309, which add height to prevent the wires from touching the die above. The stacked semiconductor die are assembled on an interposer having a standard or registered I/O footprint or one that can be easily registered or made standard.

FIGS. 4A and 4B show additional stacked semiconductor die packaging solutions wherein the semiconductor die are stacked into an assembly and interconnected to one another through holes filled with a conductive material. This allows interconnections to be made through the silicon (or other base semiconductor material). For practical reasons, the semiconductor die are commonly stacked in wafer form. This approach, however, increases the probability that there may be a bad die in some quantity of the final stacked die assemblies. Even with high yields, the factorial effect can have a significant impact on overall assembly yield. (E.g., with 98% yield per wafer, the maximum statistical yield is 83% for an 8 high stack).

FIG. 4A shows an example of such an assembly 400A with metal filled conductive vias 401 making interconnection from one die to the next through each semiconductor die from top to bottom. On one (or possibly both) surfaces the I/O are redistributed over the surface of the die face to facilitate assembly at the next interconnection level such as a module or PCB.

FIG. 4B shows another example of such a stacked die assembly with interconnections made from die to die using metal filled conductive vias. The stacked semiconductor die assembly is shown mounted onto an interposer 402 which can have a standard or registered I/O footprint or an I/O footprint that can be easily registered or made standard.

A difficulty for stacked die semiconductor package constructions is that burn in of the bare die is difficult and such die if available can be expensive. Another reason is that semiconductor die of different generations and/or from different suppliers will normally be of slightly different size and shape and often have slightly different I/O layout. Another concern for any stacked die semiconductor package solution, which does not employ known good die, is that the assembly yield is not knowable until the final assembly is tested and burned in. This is a potentially costly proposition.

BRIEF DESCRIPTION OF THE DRAWINGS

The following detailed description makes reference to the accompanying drawings, which are now briefly described.

FIGS. 16A-16B illustrate top and cross section views of another embodiment after etching.

Figure 1:
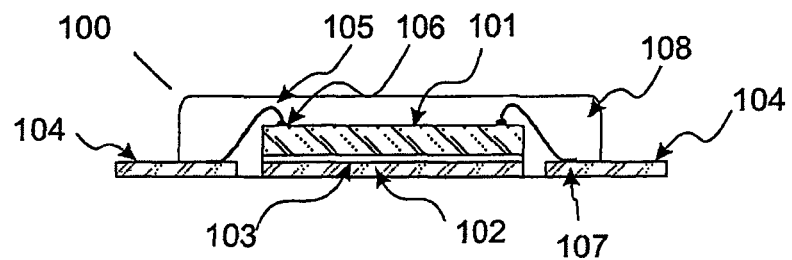
FIG. 1 illustrates in cross section a lead frame package for surface mounting.
Figure 2A:
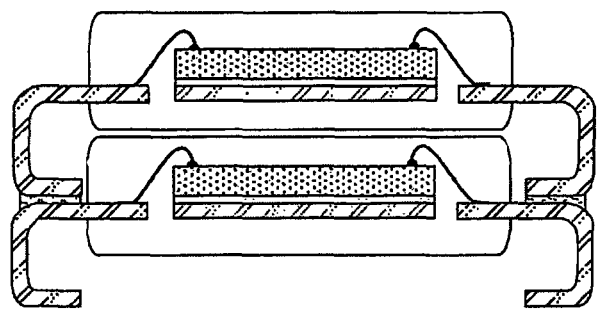
FIGS. 2A-2D illustrate in general cross section lead frame packages designed for stacking.
Figure 2B:
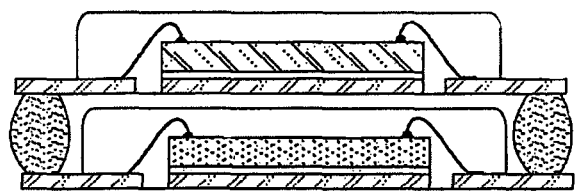
Figure 2C:
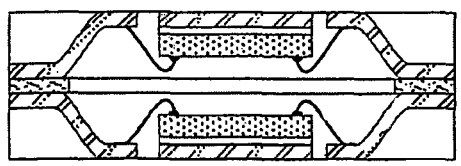
Figure 2D:
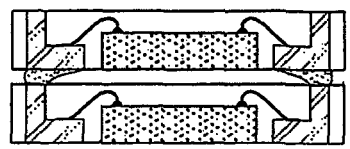
Figure 3A:
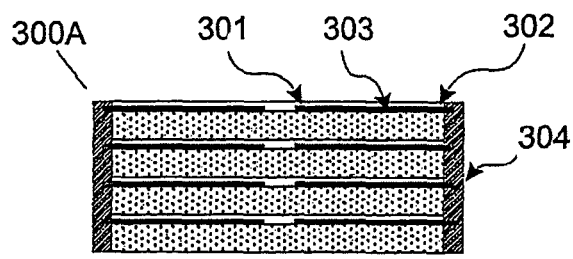
FIGS. 3A-3C illustrate in general cross section stacked semiconductor die assemblies having edge of die connections.
Figure 3B:
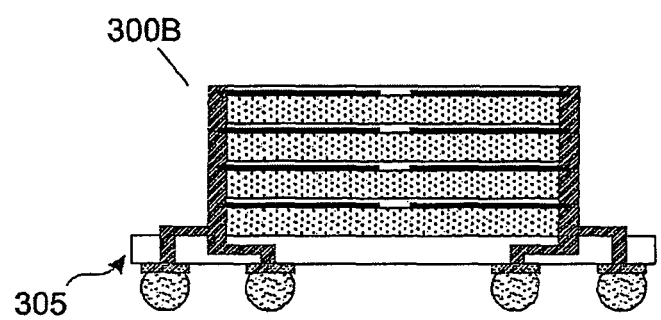
Figure 3C:
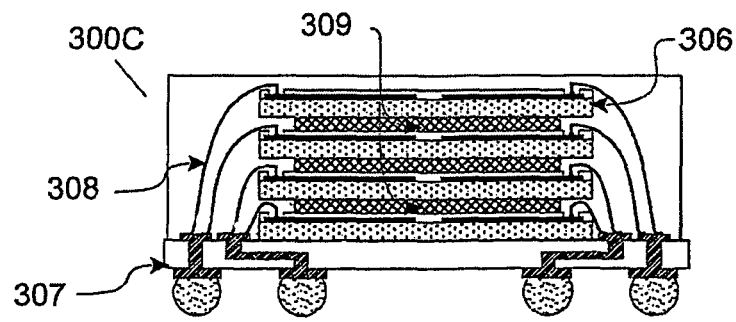
Figure 4A:
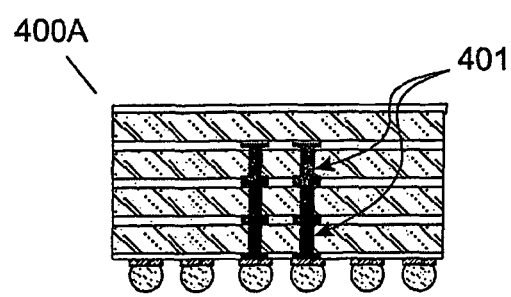
FIGS. 4A and 4B illustrate in general cross section stacked semiconductor die assemblies having interconnections made through the semiconductor by means of holes filled with a conductive material.
Figure 4B:
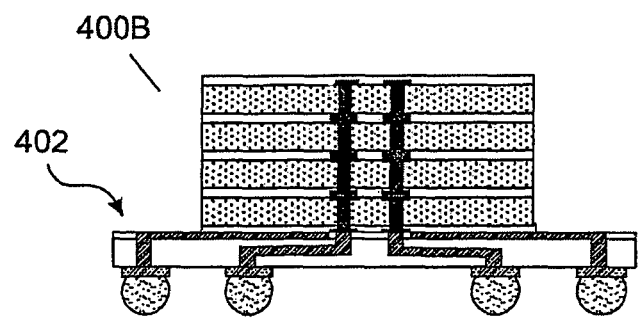

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

In the following description and in the accompanying drawings, specific terminology and images are set forth to provide a thorough understanding. In some instances, the terminology and images may imply specific details that are not required to practice all embodiments. Similarly, the embodiments described and illustrated are representative and should not be construed as precise representations, as there are prospective variation on what is disclosed that will be obvious to those of average skill in the art. Thus this disclosure is not limited to the specific embodiments describe and shown but embraces all prospective variations that fall within its scope. For brevity, not all steps will be detailed, where such details will be known to one of skill in the art having benefit of this disclosure.

Stacked IC packages, and especially memory packages, should have as many of the following qualities as possible: 1) It should be not significantly greater in area than the IC; 2) It should allow for the stacking of die of substantially the same size but should also be amenable to stacking of die of nominally different sizes as might be the case when using die from different fabricators; 3) It should be of a height no greater than the IC die including protective coatings over the active surface of the die; 4) It should be easily tested and burned in to allow for sorting for infant failures; 5) It should allow for the creation of a stacked package assembly; 6) It should be easy to inspect for manufacturing defects; 7) It should be reliable and resistant to lead breakage during handling; 8) It should be inexpensive to control costs; 9) It should offer good thermal conductivity to provide efficient heat removal; and 10) It should offer reasonable capability to perform rework and repair if needed.

Figure 5A:
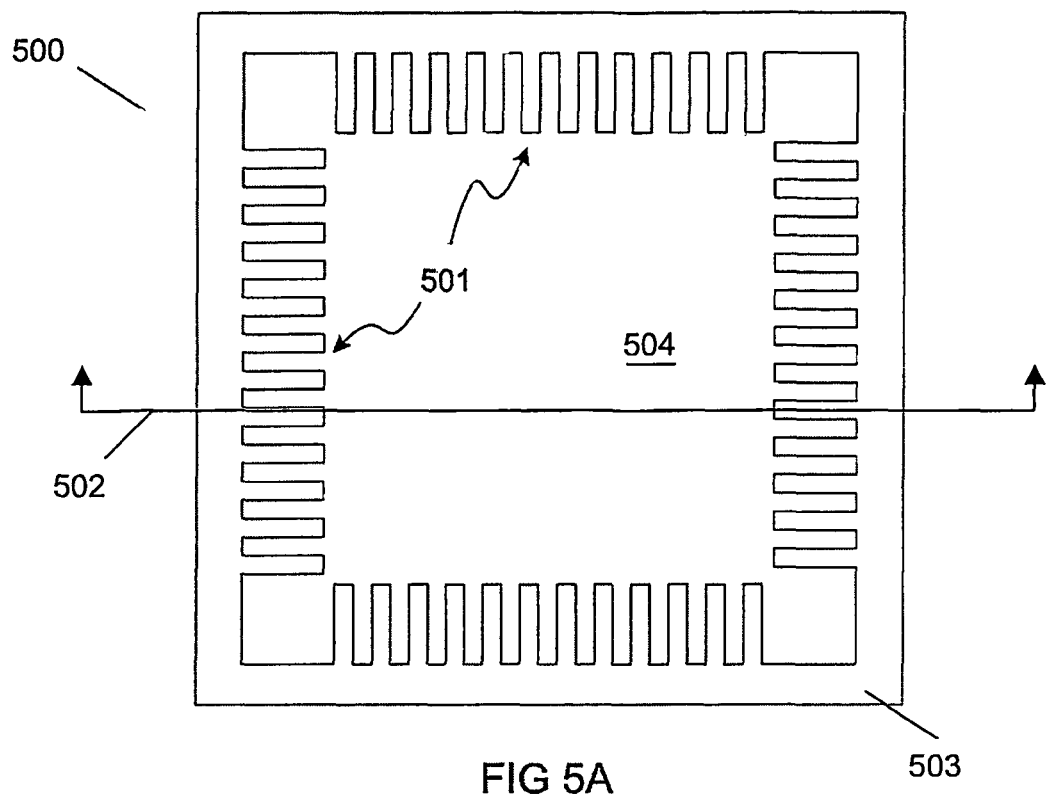
FIGS. 5A and 5B illustrate in top and cross section views a first process step for manufacturing an embodiment of a lead frame package.
Figure 5B:

A low profile IC package is disclosed herein. In some embodiments, the low profile package is suitable for stacking in a very small volume. Various embodiments may be tested and burned in before assembly. The package may be manufactured using existing assembly infrastructure, tested in advance of stack assembly and require significantly less raw material, which may help to control manufactured cost, in some embodiments. FIGS. 5A-5B show in top view 500 and cross section view 500' at line 502 in FIG. 5A, respectively, of a portion of one embodiment of a lead frame. FIGS. 5A-5B illustrate an early manufacturing step of the lead frame. The lead frame may be one site in a lead frame strip containing multiple sites, each of which can be used to package an IC. The lead frame shown in FIGS. 5A-5B has a plurality metal I/O leads 501 which extend inwardly from an outer connecting portion 503.

The leads 501 form an opening 504 within the leads that is approximately the size of the IC that is to be packaged with the leads 501. The opening 504 may be slightly larger than the IC to provide tolerance for manufacturing variations in the size of the IC, to provide an insulating gap between the leads 501 and the IC, etc. As can be seen in FIGS. 5A-5B together, the lead frame may be generally planar. A top surface, as viewed in FIG. 5A, and a bottom surface opposite the top surface, may be approximately parallel to the plane of the lead frame. The plane may be referred to as the major plane of the lead frame, and the top and bottom surfaces may be referred to as in-plane.

The lead frame may be formed of any conductive metal. For example, the lead frame may be stamped from a sheet of the conductive metal (or from a strip of the conductive metal as one lead frame site in the strip), etched into the sheet/strip, etc. Exemplary materials may include copper, iconel, alloy 42, tin, aluminum, etc. Furthermore, metal alloys may be used, or metals may be plated subsequent to the etching steps described below.

While FIG. 5A illustrates a generally square opening 504, the opening 504 may have any shape (e.g. rectangular) dependent on the shape of the IC that is to be packaged.

Figure 6A:
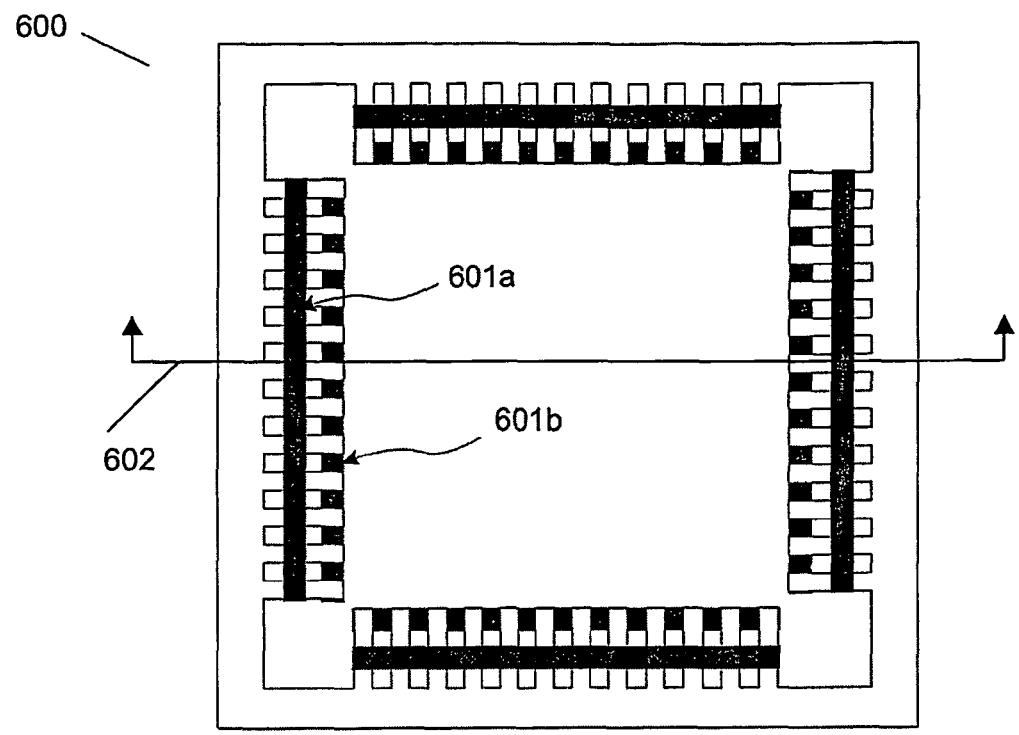
FIGS. 6A and 6B illustrate in top and cross section views a second process step for manufacturing an embodiment of the lead frame package.
Figure 6B:
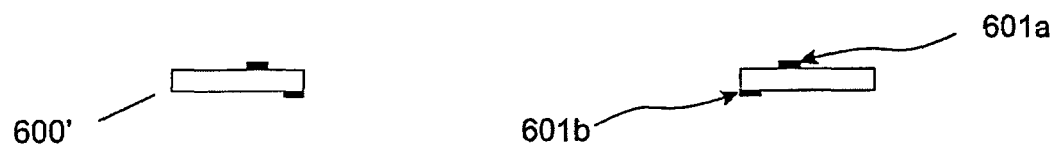

FIGS. 6A-6B show a second step in the manufacturing process in which one embodiment of the lead frame is again shown in top view 600 and cross section view 600' at the line 602 in FIG. 6A. At the point shown in FIGS. 6A-6B, an etch resistant material (more briefly "etch resist") has been applied on a top surface (etch resist 601a) and on a bottom surface (etch resist 601b) of the lead frame to prepare it for etching. The top surface and bottom surface are relative to the top view 600 shown in FIG. 6A. However, the labels 601a and 601b are relative and may be reversed in other embodiments.

The etch resist 601b is applied proximate the inward end of the each lead, while the etch resist 601a is applied further from the inward end than the etch resist 601b.

Figure 7A:
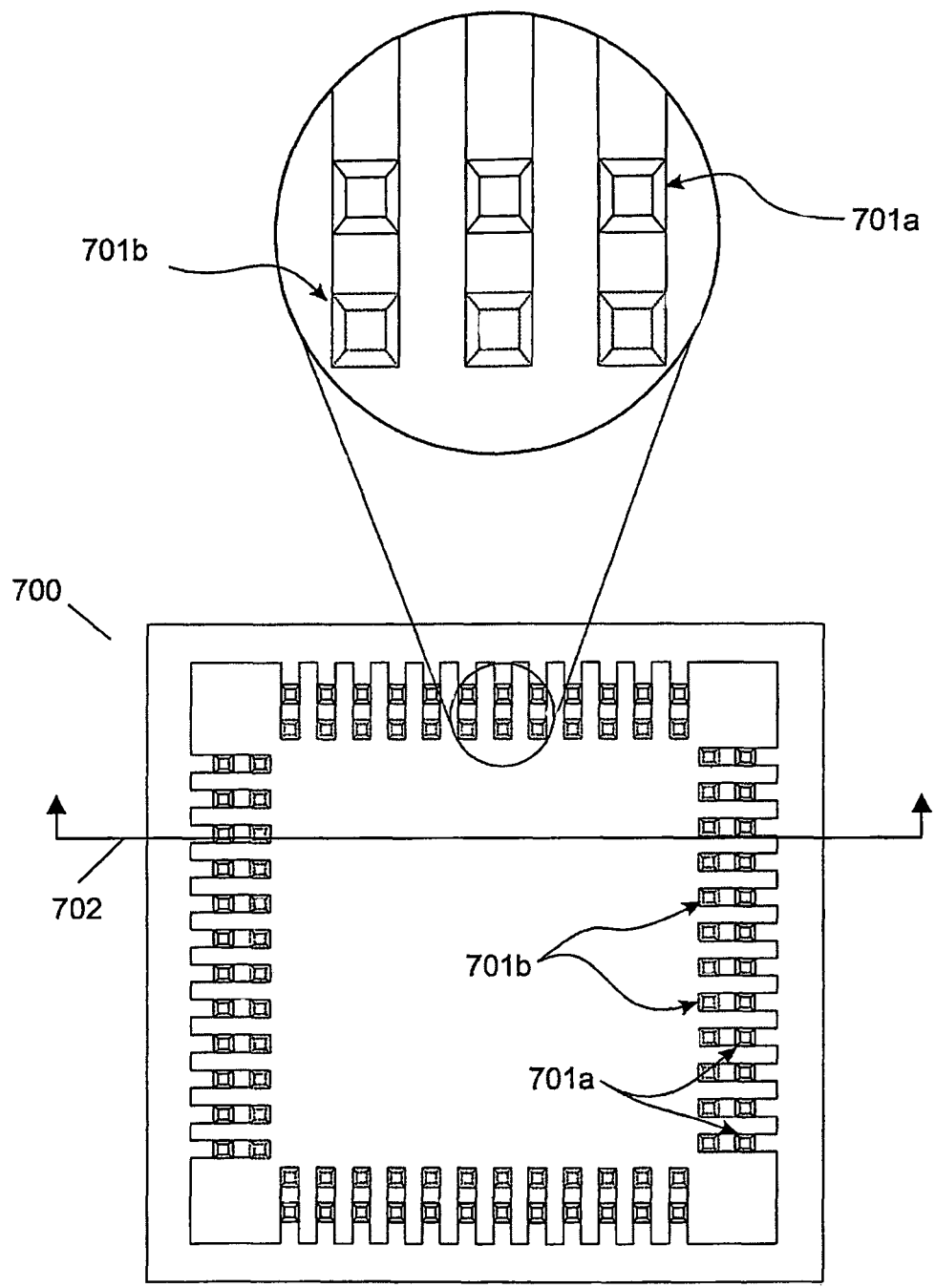
FIGS. 7A and 7B illustrate in top and cross section views a third process step for manufacturing an embodiment of the lead frame package.
Figure 7B:
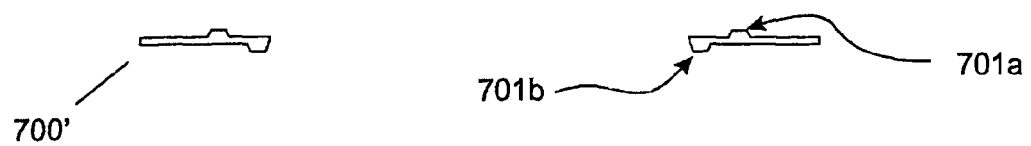

FIGS. 7A-7B show a third step in the manufacturing process after an etching process has been performed and the etch resist removed, for one embodiment The lead frame is again shown in top view 700 and cross section view 700' through the line 702, respectively in FIGS. 7A-7B. As illustrated in FIGS. 7A-7B, the leads have been etched away except for the portions covered by the etch resist, thus creating "bump" features 701a and 701b on the top and bottom surfaces, respectively, of the etched lead. The bump features are generally protrusions that extend a distance from the corresponding surface. Consistent with the locations of the etch resists 601a and 601b in FIGS. 6A-6B, the bump feature 701b is proximate the inward end of each lead and the bump feature 701a is further from the inward end than the bump feature 701b. An exploded view is provided in FIG. 7A to reveal greater detail. Phantom lines are used for the bump features 701b to indicate that they are on the far side relative to the viewer.

Figure 8A:
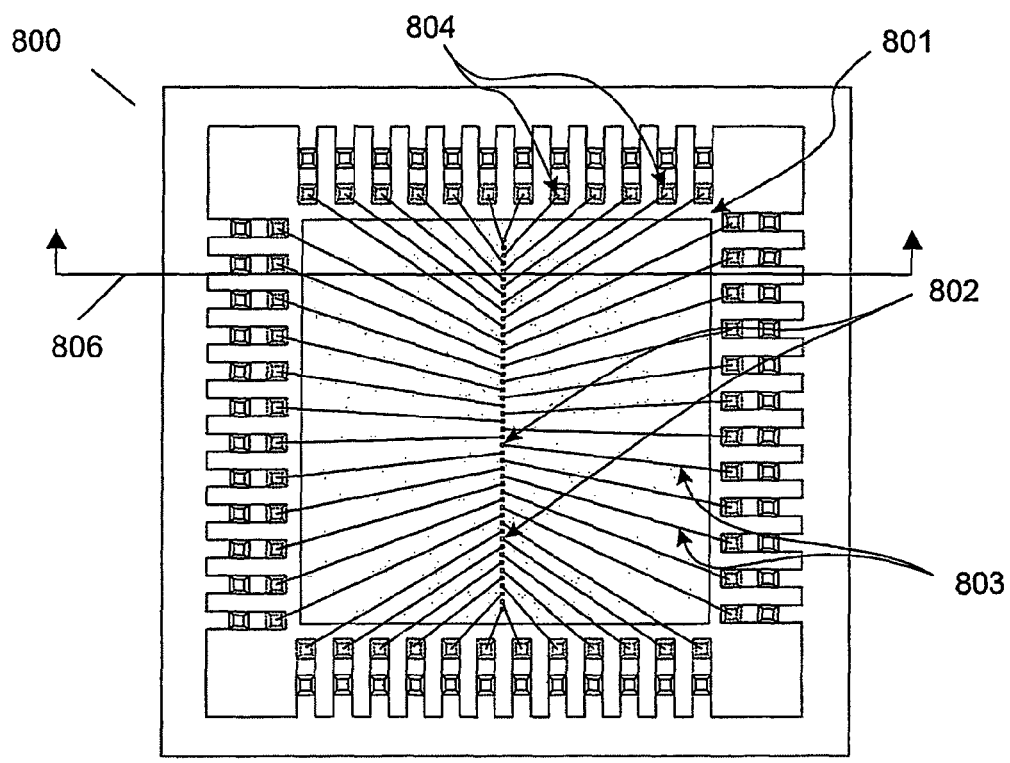
FIGS. 8A and 8B illustrate in top and cross section views a fourth process step for manufacturing an embodiment of the lead frame package.
Figure 8B:
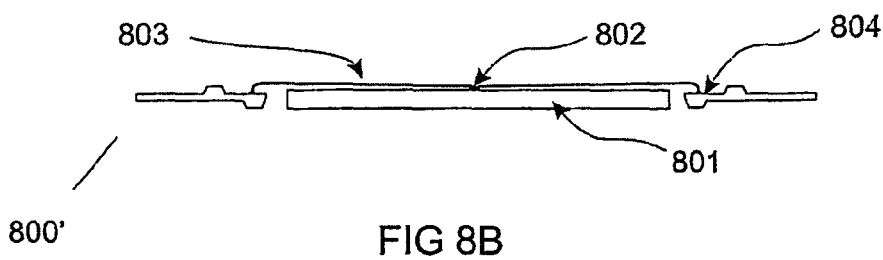

FIGS. 8A-8B show a fourth step in the manufacturing process, at which the IC is inserted into the package assembly. The lead frame is again shown in top view 800 and cross section view 800' through the line 806 in FIG. 8A for one embodiment. A semiconductor die 801 is placed centrally into the opening defined by the I/O leads. Interconnections are made from the leads (e.g. shown at 804) to the I/O terminals 802 on the die using metal bonding wires 803 of gold, aluminum, copper or other suitable conductors. The I/O terminal areas to be wire bonded are commonly provided with a finish that is suitable for assuring reliable wire bonding (e.g., gold, silver, palladium, etc.) In some embodiments, bonding wires 803 may be insulated (e.g. with a polymer). An example is the bonding wire technology developed by Microbonds, Inc., of Markham, Ontario, Canada. Insulated bond wires, when employed, may help to prevent shorting of the bond wires to the die surface or edge.

An alternative approach to interconnection involves the use of a redistribution layer which routes the die I/O terminals to near the edge of the die to reduce the length of the wire bonds. Such an embodiment may have an increased package thickness, but also shorter wire bond length which may improve electrical performance and specifically lead inductance.

The I/O terminals on the semiconductor may optionally be prepared with bumps to facilitate stitch bonding of the wires. Generally, the I/O terminals may be any connection point on the IC die for bonding to the leads. For example, peripheral I/O pads may be used instead of the terminals on the die area as shown in FIG. 8A. Furthermore, the I/O terminals need not be only in the center, as shown in FIG. 8A, but may be spread out over the area of the die, as desired.

The semiconductor die, may, in one embodiment, be thinned to a thickness suitable for meeting product reliability requirements, such as those related to charge leakage for deep trench features. For example, the die may be less than 200 μm and may even be less than 100 μm. In comparison, the lead frame may be 150 μm to 200 μm thick, in one embodiment, and thus the semiconductor die may be thinner than the lead frame in one embodiment. That is, the assembled and stackable low profile semiconductor die package may have a thickness that is not substantially larger than the thickness of the lead frame. For example, the assembled and stackable package may have a thickness that is less that 250 μm, or even less than 200 μm.

The package may be fabricated without the use of a paddle, which would otherwise increase the profile height of the assembled package, as illustrated in the figures.

Figure 9A:
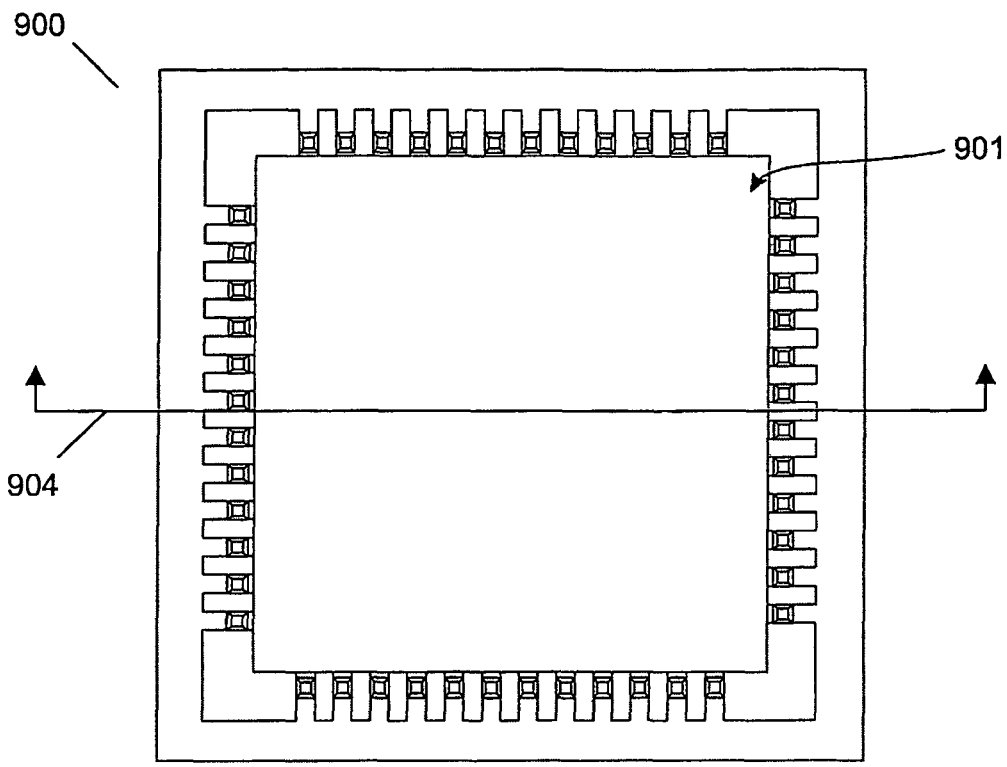
FIGS. 9A and 9B illustrate in top and cross section views a fifth process step for manufacturing an embodiment of the lead frame package.
Figure 9B:
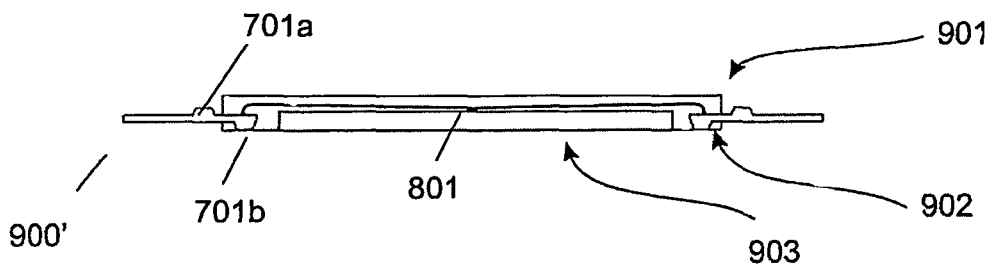

FIGS. 9A-9B show a fifth step in the manufacturing process for one embodiment, related to the encapsulation of the package assembly such as by a molding process. The lead frame assembly is again shown in top view 900 and cross section view 900' through the line 904 in FIG. 9A. In the illustrated embodiment, an encapsulant such as a resin is used to form over-molded encapsulation 901. The insulating encapsulant material has been dammed off in the mold so as to prevent the encapsulant from covering the entire length of the leads, while still allowing the encapsulant to flow under the lead to mechanically lock the lead into the encapsulant. That is, the bump features 701*b* may provide an offset from the bottom of the IC 801 to the lead surface, so that the encapsulant can surround the lead. Furthermore, in one embodiment, the bump features 701*b* serve to provide the mechanical lock for the leads. On the other hand, a remaining portion of the leads, including the bump features 701*a*, are outside of the encapsulant.

As can be seen in FIG. 9B, the bump features 701*b* may extend from the bottom surface of the leads to approximately a plane that includes the bottom side of the IC (reference numeral 903). Thus, the bump features 701*b* provide the offset as mentioned above.

FIG. 9B also shows that the bottom side 903 of encapsulated semiconductor die is exposed and is without a paddle in an effort to keep the profile of the assembly as low as possible, in this embodiment. Again, it is noted that the bottom side and the top side of the IC are relative. The bottom side 903 is opposite the top side of the IC, which has the I/O terminals of the IC.

Figure 10:
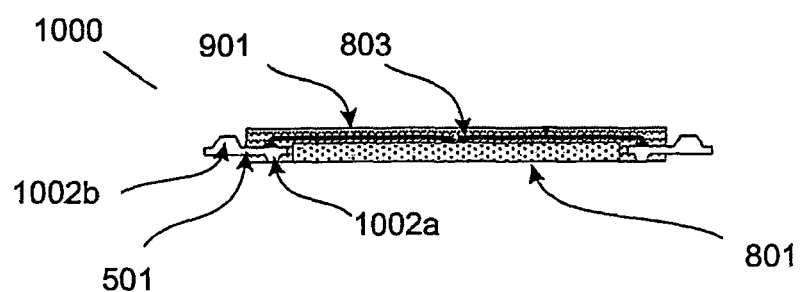
FIG. 10 illustrates in cross section view an embodiment of the lead frame package.

FIG. 10 shows a cross section view of an embodiment of the assembled semiconductor die package structure 1000 including the IC 801 and a lead 501 having an encapsulated end 1002*a* proximate to the die edge for wire bond attachment and a distal end 1002*b* which is not covered by encapsulant 901 and which has a bump feature. The excess lead frame has been trimmed away for the embodiment of FIG. 10. Within the package, the lead is encapsulated on all surfaces for the length of the lead defined by the lead frame etching process previously described, to improve lead capture by the encapsulant, using the bump feature as shown. The structure further includes bond wires 803. The bump feature on the outer lead frame is optional but may provide a connection site for stacking the packaged ICs. That is, the bump feature may provides a shape suited to limiting the amount of solder required to make interconnection between low profile semiconductor IC packages when they are stacked. The bump may also serve to improve contact of the leads during test and burn in.

Figure 11:
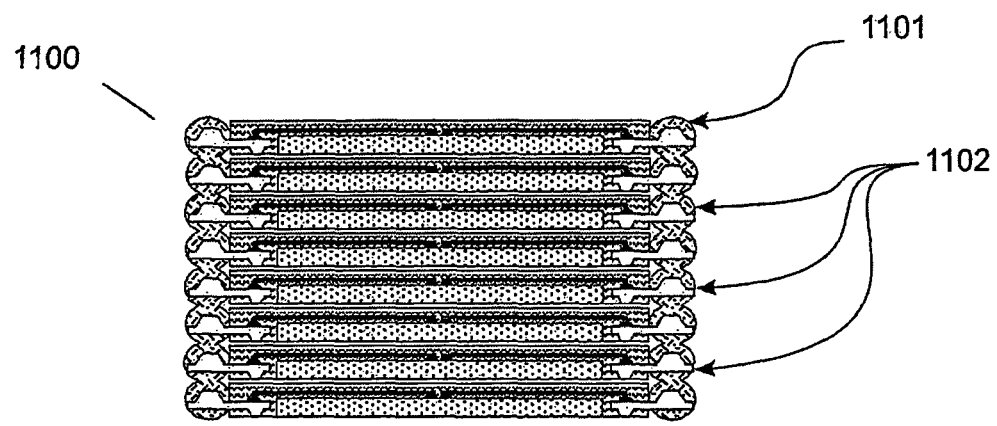
FIG. 11 illustrates in cross section view an assembled embodiment of several of the lead frame packages stacked together.

FIG. 11 shows an embodiment of a plurality of low profile semiconductor IC packages in a stack 1100. In one embodiment, each of the individual low profile semiconductor IC packages 1102 have been tested and burned in prior to assembly to improve assembly yield. That is, by testing and burning in the individual low profile semiconductor IC packages 1102, test and burn in failures may be sorted out prior to stacking the IC packages and thus may potentially improve yield. The low profile semiconductor IC packages are joined together both mechanically and electrically using a suitable joining material 1101 (e.g., tin alloy solder) while not contributing to the assembly thickness, in some embodiments. For example, assembly may be performed by reflow of solder balls or paste in a heating source such as a convection oven. Alternatively, the devices can also be stack assembled by pulse heating with a laser.

In some embodiments, a package assembly will have a total height that will not exceed limits defined by cooling airflow needs for the next level assembly while at the same time the stack low profile semiconductor IC packages may reach higher counts. For example, in an embodiment in which the ICs are memory chips and the stacked devices are to be included on a DIMM, stacks as high as eight low profile semiconductor IC packages may be formed while still providing a gap between DIMM modules. For example, the eight high stack of semiconductor IC packages may be less than 2.5 mm and may be approximately 2.0 mm in total height or less when assembled. That is, the height of the stack may not be substantially greater than a number of the IC packages multiplied by a height of the IC package. While an 8 high stack is illustrated, any number of IC packages may be stacked in other embodiments. For example, more than 4 IC packages may be stacked, or at least 8 may be stacked.

In one embodiment, a DIMM having stacked IC assemblies as described herein may allow for minimum DIMM connector spacings. The actual minimum spacing depends on a variety of factors, such as the amount of airflow available in a given system design, the amount of heat generated during use, the devices that will be physically located near the DIMMS, the form factor of the system itself, etc. The minimum spacing may be, for example, the width of the connectors themselves (e.g. about 10 mm currently, although it is anticipated that the connector width may be narrower in the future). Such a DIMM may address one or more factors that are prevalent in the electronic system industry. While memory capacity requirements are increasing (e.g. due to the increasing address capabilities of processors, such as the 64 bit processors currently available from many vendors), memory bus speeds are also increasing. To support higher speeds, DIMM connectors are often closely spaced (to minimize wire lengths to the connectors) and also the number of connectors may be limited to limit the electrical loading on the bus. Furthermore, small form factor machines such as rack mounted servers limit the amount of space available for all components. It is difficult to cost effectively provide dense, high capacity DIMMs using monolithic memory ICs, as the size of the IC dramatically increases its cost. A DIMM using lower cost ICs stacked as described herein may provide dense, high capacity DIMMs more cost effectively, in some embodiments.

Figure 12:
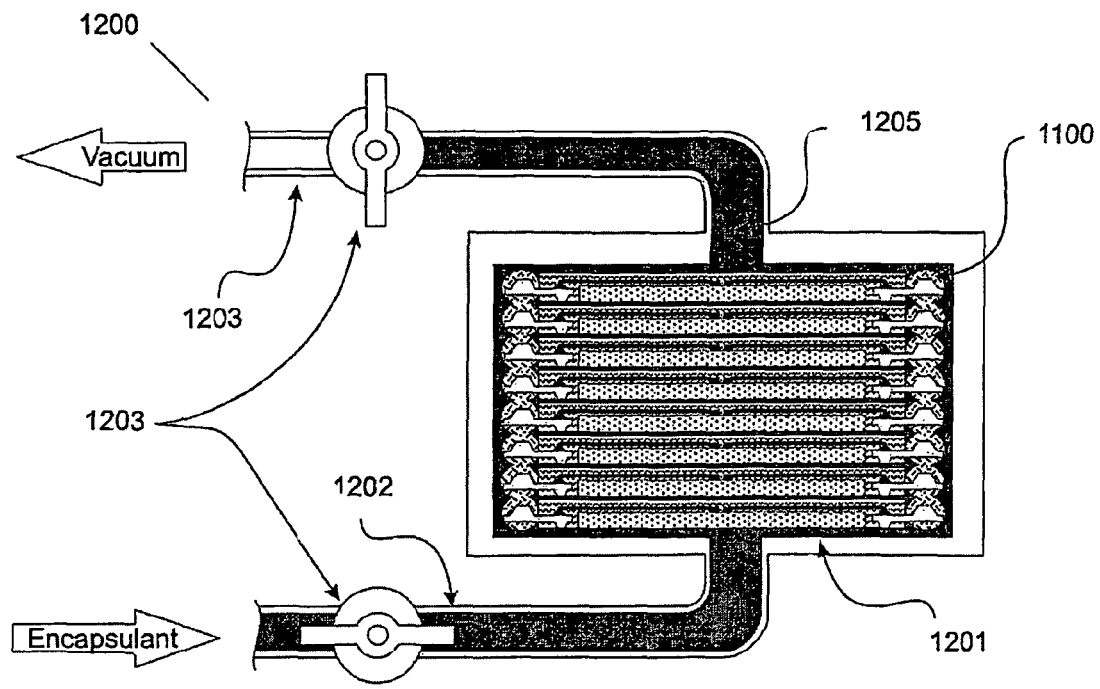
FIG. 12 illustrates in cross section view a process step for manufacturing an stacked embodiment.

FIG. 12 shows in cross section a simplified view of one embodiment of a tool 1200 for encapsulating a stack 1100 of low profile semiconductor IC packages. Gaps may form between the low profile semiconductor IC packages, and the encapsulation may help assure that the gap is filled (e.g. with an insulating resin which may be thermally conductive) to allow for more effective thermal transfer of heat through the stack 1100. The encapsulation of the stack 1100 may prevent hot spots and provide for more efficient and uniform heat flow throughout the assembly. Returning to FIG. 12, a mold cavity 1201 receives the stack 1100 and an encapsulant 1205 is injected under pressure through a pipe 1202 and a valve 1203 into the chamber 1201. To improve flow and fill of the gap a vacuum may be applied to the chamber and preclude the creation of voids. Alternatively, pressure sufficient to compress and diffuse any entrapped gasses could be applied.

Figure 13:
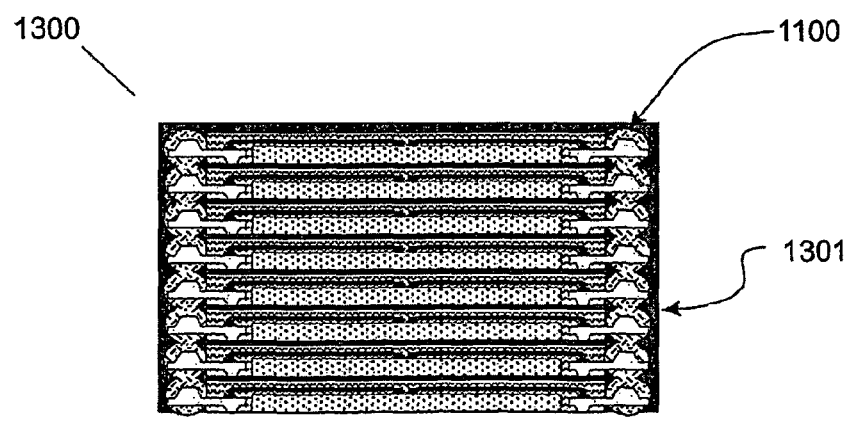
FIG. 13 illustrates in cross section view a completed assembled stacked embodiment.

FIG. 13 shows one embodiment of an assembled and encapsulated structure 1300 comprised of a stack 1100 of the low profile semiconductor IC packages electrically and mechanically joined together using a suitable conductor material and having an over molded encapsulant 1301 to yield a stacked fully encapsulated package assembly suitable for mounting on to the surface of a PCB such as a DIMM module PCB. As can be seen, the solder connections at the bottom of the assembled and encapsulated structure 1300 may be exposed for connection to the DIMM module.

Figure 14:
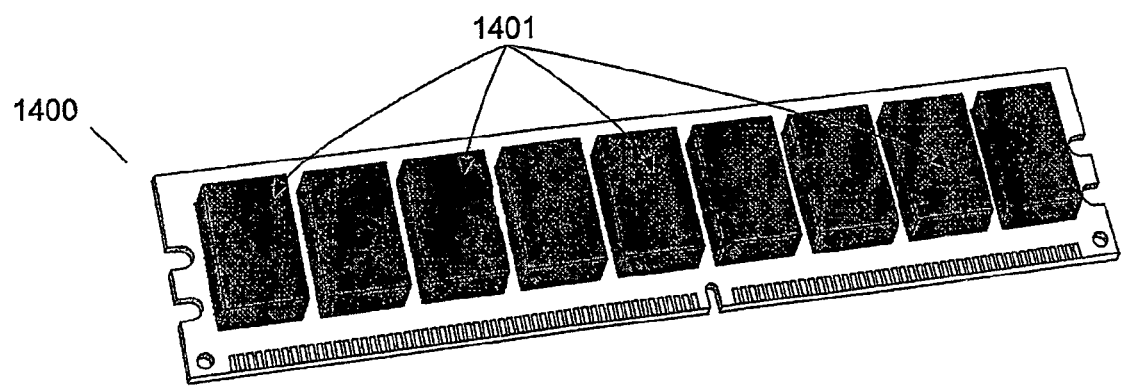
FIG. 14 illustrated one embodiment of several stacked packages assembled on a dual inline memory module (DIMM).

FIG. 14 shows one embodiment of a DIMM module PCB assembly 1400 with a plurality of assembled and encapsulated structures 1401 of low profile IC packages mounted on the PCB.

Figure 15A:
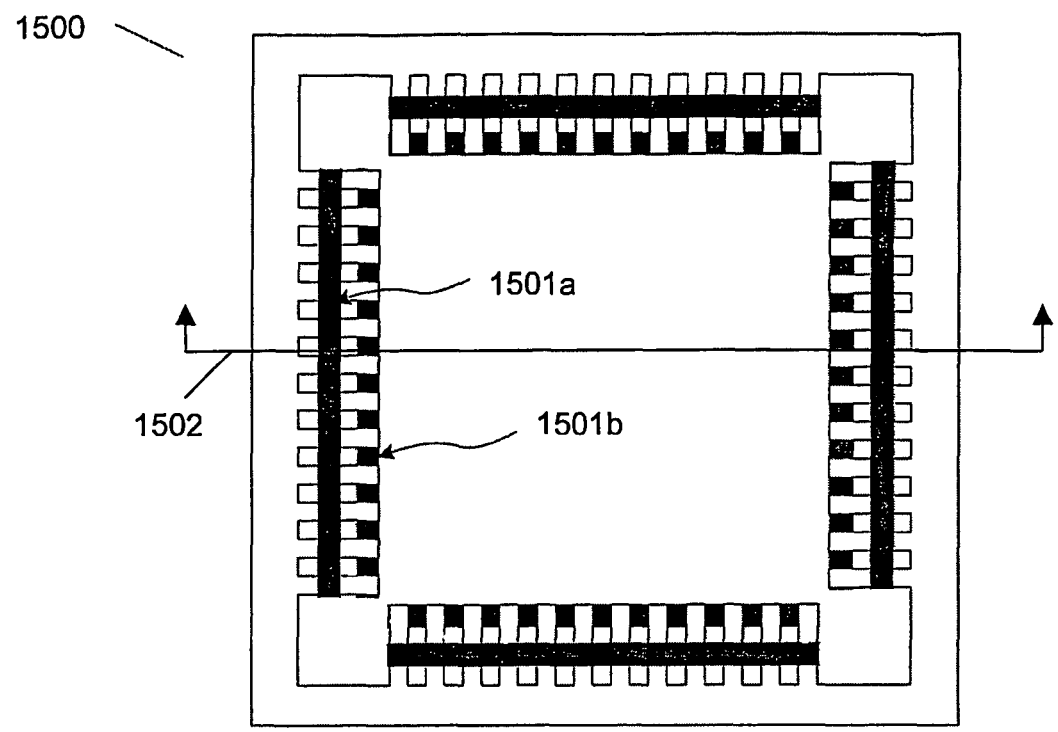
FIGS. 15A-15B illustrate top and cross section views of another embodiment with etch resist applied.
Figure 15B:
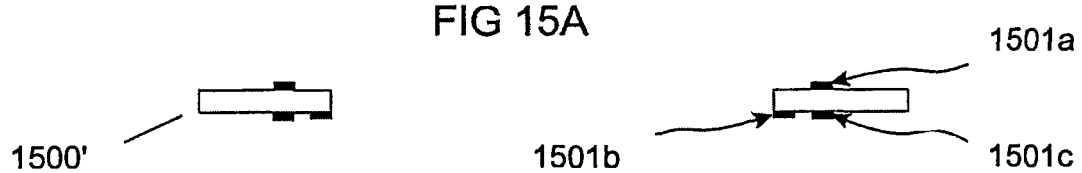

FIGS. 15A-15B, 16A-16B, and 17 illustrate another embodiment of the packaging techniques described herein. FIGS. 15A-15B are similar to the step shown in FIGS. 6A-6B for the above embodiments. FIGS. 16A-16B are similar to the step shown in FIGS. 7A-7B for the above embodiments. Generally, the embodiment shown in FIGS. 15A-15B, 16A-16B, and 17 may include a third bump feature on the bottom side of the lead, located a similar length from the inward end of the leads as the second bump feature on the top side of the lead. Thus, a nearly continuous connection may be possible using the second and third bump features in a stack, which may permit the use of a conductive film between the ICs to form a stack.

FIGS. 15A-15B show one embodiment of the lead frame in top view 1500 and cross section view 1500' at the line 1502 in FIG. 15A, respectively. At the point shown in FIGS. 15A-15B, an etch resist has been applied on a top surface (etch resist 1501*a*) and on a bottom surface (etch resists 1501*b* and 1501*c*) of the lead frame to prepare it for etching. The etch resists 1501*a* and 1501*b* are similar to the etch resists 601*a* and 601*b* in FIGS. 6A-6B, respectively. Additionally, the resist 1501*c* is applied in approximately the same location of the bottom surface of the lead as the resist 1501*a* is applied, with respect to distance from the inward end of the lead.

FIGS. 16A-16B show an embodiment at the step in the manufacturing process after the etching has been performed and the etch resist removed. The lead frame is again shown in top view 1600 and cross section view 1600' through the line 1602, respectively in FIGS. 16A-16B. As illustrated in FIGS. 16A-16B, the leads have been etched away except for the portions covered by the etch resist, thus creating bump features 1601*a*, 1601*b*, and 1601*c*. An exploded view is provided in FIG. 16A to reveal greater detail. Phantom lines are used for the bump features 1601*b* to indicate that they are on the far side relative to the viewer.

Figure 17:
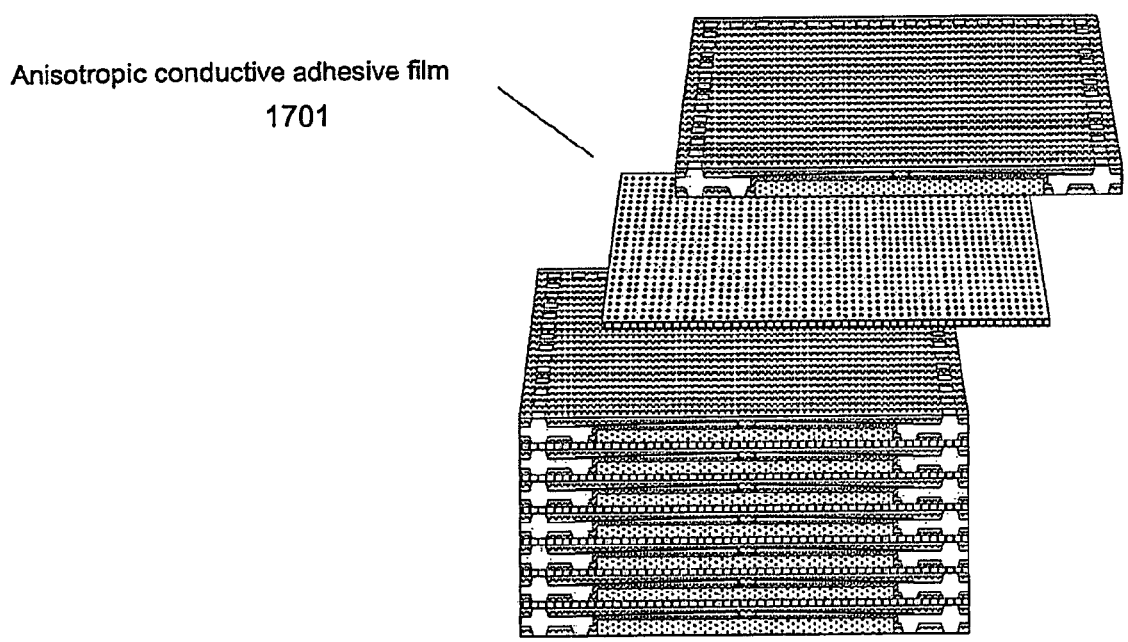
FIG. 17 is a cross section view of another stacked embodiment.

The remainder of the packaging process for a single IC may be similar to the above described embodiments. When stacking the ICs, solder may be used as described above. Alternatively, since the bump features 1601*a* and 1601*c* form a nearly continuous connection from top to bottom of the IC, a conductive film may be used to make the connections. For example, FIG. 17 illustrates an embodiment in which an anisotropic conductive adhesive film 1701 is used to connect between stacked ICs. The film 1701 may provide both thermal and electrical connection between the stacked ICs and may permit the soldering and injection encapsulation steps to be eliminated for this embodiment.

Figure 18:
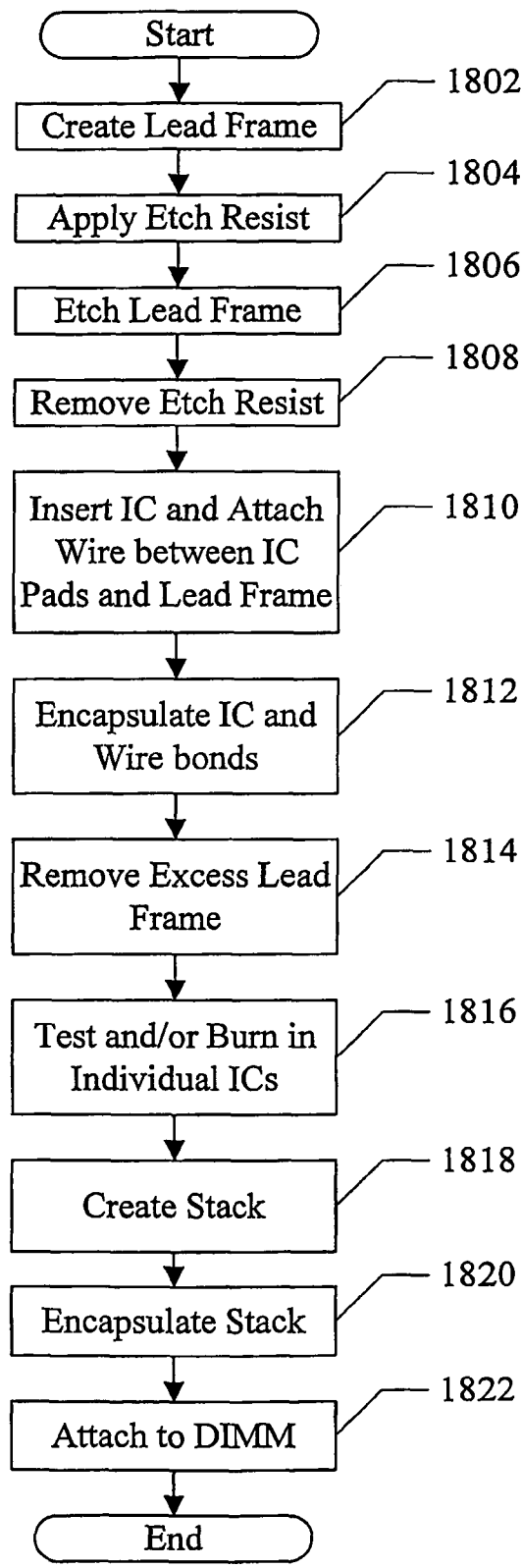
FIG. 18 is a flowchart illustrating one embodiment of a manufacturing process.

Turning now to FIG. 18, a flowchart is shown illustrating one embodiment of a method of manufacturing a stacked IC or DIMM embodiment. The lead frame may be created (block 1802). For example, the lead frame may be part of a lead frame strip and may be stamped into the strip, etched, etc. Etch resist may be applied to the lead frame (block 1804). The etch resist may be applied in one or more locations, in various embodiments. For example, the etch resist may be applied to the bottom surface of the leads proximate to the inward ends of the leads, and optionally to the top surface of the leads further from the inward ends (and still further optionally to the bottom surface further from the inward ends). The lead frame is etched, creating one or more bump features on each lead below the etch resists (block 1806) and the etch resist is removed (block 1808). The IC to be packaged is inserted into the opening between the leads, and bonding wire is used to attach the IC pads to the leads (block 1810). The IC and wires bonds are encapsulated, along with the inward ends of the leads (block 1812) and the excess lead frame (e.g. beyond the optional second and third bump features, in some embodiments) is removed (block 1814). The ICs may then be tested and/or burned in, to eliminate failures prior to stacking (block 1816). The stack may then be created from two or more ICs (block 1818), and the stack may be encapsulated in some embodiments (block 1820). One or more stacked ICs may be attached to a DIMM (block 1822).

In one embodiment, a lead frame for an integrated circuit (IC) comprises a plurality of inward extending leads formed of a conductive metal. The leads have a first surface and a second surface opposite the first surface. Each lead has a first feature on the first surface proximate an inward end of the lead, and the plurality of leads form an opening within the leads into which the IC is insertable. The opening is approximately (e.g. not smaller than) a size of the IC.

In an embodiment, an IC assembly comprises an IC having a top surface comprising a plurality of input/output terminations, a plurality of leads arranged around the IC, a plurality of bond wires, and an encapsulant. Each lead has a first surface and a second surface opposite the first surface, and has a feature protruding from the first surface proximate an inward end of the lead nearest the IC. The feature extends from the first surface to approximately a plane that includes a bottom surface of the IC. Each bond wire connects a respective lead to a respective I/O terminal on the IC. The encapsulant seals the bond wires, the IC, and a first portion of the leads that includes the feature. The feature creates on offset from the bottom of the IC to permit the encapsulant to surround the first portion.

In one embodiment, a method comprises creating a lead frame comprising a conductive metal having a plurality of inwardly projecting leads. An opening formed within the leads is approximately a size of an integrated circuit (IC) to which the leads are to be connected. The method comprises applying an etch resist proximate the inward ends of the leads on a first surface of the leads; etching the lead frame subsequent to applying the etch resist; and removing the etch resist subsequent to etching the lead frame. The etched lead frame comprises leads having a feature protruding from the first surface proximate the inward ends of the leads.

In another embodiment, a dual in-line memory module (DIMM) comprises a plurality of stacked memory assemblies electrically coupled to a DIMM printed circuit board (PCB). Each of the plurality of stacked memory assemblies has a total height that permits a minimum DIMM connector spacing with DIMMs in adjacent connectors. Each of the plurality of stacked memory assemblies comprises a plurality of integrated circuit (IC) assemblies stacked vertically.

Numerous variations and modifications will become apparent to those skilled in the art once the above disclosure is fully appreciated. It is intended that the following claims be interpreted to embrace all such variations and modifications.

What is claimed is:

1. A lead frame for an integrated circuit (IC), the lead frame comprising:
   a plurality of inwardly extending leads formed of a conductive metal, each lead having:
   a first surface substantially parallel to a common plane and having a first feature proximate an inward end of the lead, wherein the first feature protrudes from the first surface, and
   a second surface opposite the first surface having a second feature further from the inward end of the lead than the first feature, wherein the second feature protrudes from the second surface and wherein the plurality of leads form an opening within the leads into which the IC is insertable, wherein the opening is approximately a size of the IC.

2. The lead frame as recited in claim 1 wherein each lead further comprises:
a third feature protruding from the first surface, wherein the third feature is approximately the same distance from the inward end as the second feature.

3. The lead frame of claim 1, wherein the thickness of the lead frame is between 150 μm and 200 μm.

4. The lead frame of claim 2, wherein the third feature is configured to couple the lead frame to a plurality of integrated circuits.

5. The lead frame of claim 1 further comprising:
an area of the second surface adapted to be wire bonded to a terminal on a die,
wherein the area of the second surface is provided with a finish that is suitable for assuring reliable wire bonding.

6. The lead frame of claim 5 wherein the finish is formed from gold, silver, or palladium.

7. The lead frame of claim 5 wherein the area of the second surface adapted to be wire bonded is at a location on the second surface opposite the first feature.

8. The lead frame of claim 1 wherein the first feature is a bump feature that extends a distance from the first surface and the second feature is a bump feature that extends a distance from the second surface.

9. The lead frame of claim 1 wherein the first feature and the second feature have shapes that are substantially identical to each other.

\* \* \* \* \*